United States Patent
Asai et al.

(10) Patent No.: US 6,170,633 B1
(45) Date of Patent: *Jan. 9, 2001

(54) ELECTRONIC-COMPONENT SUPPLYING APPARATUS AND METHOD

(75) Inventors: Koichi Asai, Nagoya; Yasuo Muto, Chiryu; Shinsuke Suhara, Kariya, all of (JP)

(73) Assignee: Fuji Machine Mfg. Co., Ltd., Chiryu (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/897,692

(22) Filed: Jul. 21, 1997

(30) Foreign Application Priority Data

Jul. 24, 1996 (JP) .................................... 8-194798

(51) Int. Cl.[7] .................................. B65G 37/00
(52) U.S. Cl. ................. 198/346.1; 198/348; 198/349.6
(58) Field of Search .................... 714/749, 751, 714/806; 198/346.1, 348, 349.6

(56) References Cited

U.S. PATENT DOCUMENTS

| Re. 33,780 | 12/1991 | Itagaki et al. . |
| 5,044,069 | 9/1991 | Asai et al. . |
| 5,208,969 | 5/1993 | Hidese . |
| 5,329,692 | 7/1994 | Kashiwagi . |

FOREIGN PATENT DOCUMENTS

| B2-2-53954 | 11/1990 | (JP) . |
| 6-342994 | 12/1994 | (JP) . |

*Primary Examiner*—Donald W. Underwood
(74) *Attorney, Agent, or Firm*—Oliff & Berridge, PLC

(57) ABSTRACT

An electronic-component supplying apparatus, including a bed with two linear guides; six tables movably supported by the guides, each table supporting electronic-component supplying cartridges such that respective component-supply portions of the cartridges are arranged along a straight line parallel to the guides, the six tables including a first group of three tables and a second group of three tables; three carriers which are movable, independent of one another, through three routes, respectively, each carrier being stoppable at any position on the corresponding route, the three routes extending parallel to one another and the guides, within a carrier-movement area on the bed; engaging devices and engageable portions each of which is disengageably engageable with at least one corresponding engaging device of the engaging devices, one of (a) each of the six tables and (b) each of the three carriers supporting a corresponding one of the engaging devices, the other of (a) the each of the six tables and (b) the each of the three carriers supporting a corresponding one of the engageable portions; a first retracting device which retracts the tables of the first table group, to a first waiting area as one of two side areas on both sides of the carrier-movement area; and a second retracting device which retracts the tables of the second table group, to a second waiting area as the other side area.

15 Claims, 20 Drawing Sheets

ELECTRONIC-COMPONENT SUPPLYING APPARATUS AND METHOD

BACKGROUND OF THE INVENTION

1. Field of the Invention

The present invention relates to an electronic-component ("EC") supplying apparatus and method and in particular to the art of improving EC supplying efficiency.

2. Related Art Statement

Japanese Patent Application laid open for opposition under Publication No. 2(1990)-53954 discloses an EC supplying apparatus which supplies ECs to an EC mounting apparatus which mounts the ECs on an object such as a printed circuit board ("PCB"). The prior EC supplying apparatus includes two tables for supplying the ECs. Each of the two tables is supported by linear table guides provided on a bed, such that each table is movable relative to the bed. Each table supports a plurality of EC supplying cartridges such that respective component-supply portions of the cartridges are arranged along a straight line parallel to the table guides. A nut which is fixed to each table is threadedly engaged with a feeding screw which extends, on the bed, parallel to the table guides and which is rotated by a servomotor. Therefore, when each of the two servomotors is driven, the corresponding table is moved via the corresponding feeding screw and nut, so that the cartridges on that table are sequentially moved one by one to a component-supply position where each cartridge supplies ECs from the component-supply portion thereof.

Since the prior EC supplying apparatus includes not one but two tables, each table may have such dimensions which allow only one table to be used for supplying ECs to such a PCB which does not need more than the cartridges that can be supported by one table, and which require two tables to be used for supplying ECs to such a PCB which needs more than the cartridges that can be supported by one table but does not need more than the cartridges that can be supported by two tables. In the first case, the other table is not used or moved and, in the second case, the two tables may be moved, either alternately or simultaneously, for supplying ECs.

Thus, the tables employed in the above-indicated apparatus have smaller dimensions than those of conventional tables that had been designed to be suitable for such PCBs which need the largest number of cartridges, i.e., the largest number of ECs and/or the largest number of sorts of ECs. Accordingly, the tables of the prior EC supplying apparatus can respond more quickly and can move at higher speeds. Therefore, the EC supplying apparatus enjoys improved work efficiency. In addition, the vibration produced when each table is moved and stopped is reduced, which leads to reducing the possibility that the EC mounting apparatus fails to take (e.g., suck) ECs from the EC supplying apparatus.

However, the prior EC supplying apparatus employs at most two tables. Accordingly, if a greater number of cartridges are needed to supply ECs to a PCB, the two tables are required to have greater dimensions. In such cases, the tables cannot be moved at sufficiently high speeds, which leads to lowering the work efficiency of the EC supplying apparatus.

In the above-described situation, Japanese Patent Application laid open for inspection under Publication No. 6(1994)-342994 discloses an EC supplying apparatus which employs three or more tables for supplying ECs. In this apparatus, too, linear table guides are provided on a bed, and three or more tables are supported on the table guides such that each table is movable relative to the bed. Each table supports a plurality of EC supplying cartridges such that respective component-supply portions of the cartridges are arranged along a straight line parallel to the table guides. In addition, two carrier guides which extend parallel to the table guides are provided on the bed, and two carriers are supported on the carrier guides such that each carrier is movable relative to the bed. A nut which is fixed to each carrier is threadedly engaged with a feeding screw which extends, on the bed, parallel to the table guides and which is rotated by a servomotor. Each of the two carriers includes an engaging device which is disengageably engageable with one corresponding table, or each of two or more corresponding tables, and moves the one or each table to a component-supply area as an intermediate area on the bed in a direction parallel to the table guides, so that the one or each table supplies ECs in the component-supply area.

Since the above-indicated second prior apparatus employs two carriers, two tables of the three or more tables can simultaneously be moved by the two carriers, respectively. Thus, the second prior apparatus can advantageously supply ECs like the first prior apparatus wherein the two tables are directly driven and moved. In addition, each carrier can selectively be engaged with each of two or more tables. Therefore, the second prior apparatus can employ three or more tables for supplying ECs, even if it employs only two carriers. Accordingly, the tables employed in the second apparatus can have still smaller dimensions and can move at still higher speeds, which leads to further improving the work efficiency of the apparatus.

However, since the second prior apparatus has only two carriers, there are some cases where it may need much time to change a table which is currently supplying ECs in the component-supply area, to another table which is next to supply ECs in the same area. If, after one of the two carriers retracts, from the component-supply area, a first table which has completed the supplying of ECs, and before the same carrier engages a third table to follow a second table which is now supplying ECs in the component-supply area, and prepares for moving the third table to the component-supply area, the second table engaged with the other carrier completes the supplying of ECs, it needs a wasteful time after the second table completes the EC supplying and before the third table is ready for EC supplying.

SUMMARY OF THE INVENTION

It is an object of the present invention to provide EC supplying apparatus and method which employ small tables and quickly change the tables with one another for supplying ECs.

It is another object of the present invention to provide an EC supplying apparatus which employs carriers and drive devices each of which moves a corresponding one of the carriers and each of which is constructed by major parts provided apart from the corresponding one carrier.

It is another object of the present invention to provide an EC supplying apparatus which employs tables and an exclusive table retracting device which retracts the tables to a waiting area.

It is another object of the present invention to provide a table retracting device at low production cost.

It is another object of the present invention to provide an EC supplying apparatus which supplies ECs in a plurality of modes.

According to the present invention, there is provided electronic-component supplying apparatus and method which have each one of the technical features which will be described below in respective paragraphs given parenthesized sequential numerals (1) to (14). Any technical feature which includes one or more other technical features does so by a reference at the beginning to the numeral or numerals of the other technical feature or features. Thus, as far as the present invention is concerned, two or more of the technical features (2) to (12) may be combined with each other, if appropriate.

(1) According to a first feature of the present invention, there is provided an electronic-component supplying apparatus, comprising a bed including at least one linear table guide, at least four tables each of which is supported by the table guide such that the each table is movable relative to the bed, the each table supporting a plurality of electronic-component supplying cartridges such that respective component-supply portions of the cartridges are arranged along a straight line parallel to the table guide, the at least four tables including at least one table belonging to a first table group, and at least one table belonging to a second table group, at least three carriers each one of which is movable, independent of the other carriers, through a corresponding one of at least three routes which is associated with the each one carrier exclusively, the each one carrier being stopable at any position on the corresponding one route, the at least three routes extending parallel to one another and the table guide, within a carrier-movement area on the bed which is an intermediate area on the bed in a direction parallel to the table guide, a plurality of carrier-related engaging devices and a plurality of engageable portions each of which is disengageably engageable with at least one corresponding engaging device of the engaging devices, one of (a) each of the at least four tables and (b) each of the at least three carriers supporting a corresponding one of the engaging devices, the other of (a) the each of the at least four tables and (b) the each of the at least three carriers including a corresponding one of the plurality of engageable portions, a first table retracting device which retracts the at least one table of the first table group, to a first waiting area on the bed which is one of two side areas on both sides of the intermediate area on the bed in the direction parallel to the table guide, and a second table retracting device which retracts the at least one table of the second table group, to a second waiting area on the bed which is the other side area on the bed. In the present electronic-component ("EC") supplying apparatus, the respective exclusive routes for the three or more carriers are provided in the carrier-movement ("CM") area such that the exclusive routes extend parallel to each other. Thus, each one of the carriers can pass by the other carriers. The three or more carriers are engaged, as needed, with appropriate ones of the four or more tables for concurrently carrying three task, i.e., moving a table for supplying ECs in the CM area, retracting another table which has completed the supplying of ECs from the CM area, and preparing yet another table which is to supply ECs next. The supplying of ECs may be carried out by moving a single table at one time. However, as will be described later on the preferred embodiments of the invention, it may be carried out such that while a first table is moved for supplying ECs in the CM area, a second table which is to supply ECs next follows the first table at acceleration and deceleration whose absolute values are smaller than those of the first table. That is, the supplying of ECs may be carried out by moving the first and second tables in the CM area as if they were a single table. During this, a third table which has completed the supplying of ECs may be retracted from the CM area, and a fourth table may be prepared for following the second table in the CM area after the first table completes the EC supplying. Alternatively, the supplying of ECs may be performed by moving two tables in synchronism with each other as if they were a single table. Even if two tables may be moved for supplying ECs, it can be said that one of the two tables is waiting for the completion of EC supplying of the other table. That is, even if two tables may be moved for supplying ECs, they will not simultaneously complete their EC supplying, i.e., will complete their EC supplying at different timings. Therefore, while one of the two tables which has completed the EC supplying is retracted, the other table is supplying ECs, and another table is prepared for supplying ECs. Each of the carriers may be of a "driven" type, as will be described on the preferred embodiments of the invention, which is moved when a feeding screw is rotated which is provided on the bed for the each carrier via a nut which is fixed to the each carrier and is threadedly engaged with the screw. Alternatively, each carrier may be of an "auto" type which is moved when an electric motor mounted on the each carrier is driven to rotate a nut which is rotatably mounted on the each carrier and is threadedly engaged with a feeding screw fixed to the bed. Each carrier may be of another "auto" type which is provided by a movable element of a linear motor. The carrier-related engaging devices may be provided on either the carriers or the tables, respectively. The total number of the engaging devices provided on the respective carriers is smaller than that of the engaging devices provided on the respective tables, if the total number of the carriers is smaller than that of the tables. Each of the EC supplying cartridges may include a supply reel around which an EC tape holding ECs at a regular interval in the longitudinal direction thereof is wound, and a feeding device which intermittently feeds the EC tape at a feeding pitch equal to the regular interval of EC holding of the EC tape so that the ECs are moved one by one to the EC-supply portion of the each cartridge, i.e., EC-pick-up portion of the same from which the EC is picked up by an EC pick-up apparatus. Alternatively, each cartridge may include a box which accommodates an EC tape and a drawing device which intermittently draws the EC tape at a drawing pitch. The cartridges are not limited to those which supply ECs in the form of EC tapes. For example, each cartridge may include a casing in which ECs are arranged in an array, and a vibrating or tilting device which vibrates or tilts the casing so as to move and supply the ECs. The first and second table retracting devices may be provided by exclusive table retracting devices, or alternatively by the carriers. In the former case, the exclusive table retracting devices receive the tables from the carriers, and retract them to the waiting areas. In the latter case, the respective exclusive routes provided in the CM area for the three or more carriers are extended to the first and second waiting areas on both sides of the CM areas, so that the carriers may move to the waiting areas. Within the CM area, each of the carriers can be stopped at any desired position for supplying an EC but, within the waiting areas, the carriers function as the table retracting devices for moving the carriers from the CM area to the waiting areas. In the present apparatus, the four or more tables are divided into a first and a second table group, and the first and second table retracting devices retract the tables of the first and second table groups to the first and second waiting areas, respectively. As will be described on the preferred embodiments of the invention, the supplying of ECs may be carried out by using only one of the two tables groups, while the other table group remains waiting in the corresponding waiting area, permitting an operator to changing one or more of the cartridges on each table with another or other cartridges. The four or more tables may be divided into two groups each including the same number of tables or may be divided to two groups including different numbers of tables, respectively. Thus, in the present EC supplying apparatus, a number of EC supplying cartridges are divided into four or more groups, which are mounted on the four or more tables, respectively. Therefore, even in the case where it is needed to supply a greater number of ECs or a greater number of sorts of ECs, it is not needed to employ tables with greater dimensions. Thus, the tables can be moved at high speeds to supply ECs quickly. Since the three or more carriers are simultaneously used for moving a first table for supplying ECs, having a second table waiting for next supplying ECs, and retracting a third table which has completed the EC supplying, the second table can start supplying ECs immediately after the first table completes the EC supplying. Accordingly, the EC supplying operation is carried out without needing any wasteful time. In the case where the second table is also moved to follow the fist table which is being moved for supplying ECs, the second table can replace the first table in a very short time when the first table completes the EC supplying. Thus, the EC supplying efficiency of the present apparatus is much improved.

(2) According to a second feature of the invention which includes the first feature (1), the EC supplying apparatus further comprises a same number of feeding screws as a number of the at least three carriers, the feeding screws being provided on the bed such that the feeding screws extend parallel to one another and the table guide, a plurality of nuts each of which is fixed to a corresponding one of the carriers and is threadedly engaged with a corresponding one of the feeding screws, and a plurality of drive devices each of which rotates a corresponding one of the feeding screws which is associated with the each drive device exclusively. In the present apparatus, the carriers are moved as the corresponding feeding screws are rotated by the corresponding drive devices, respectively. It is only the nuts that are respective parts of carrier driving devices and are mounted on the carriers. Thus, each carrier enjoys a light mass and accordingly can be moved at high speeds. The EC-supply efficiency of the present apparatus is thus improved.

(3) According to a third feature of the invention which includes the first feature (1) or the second feature (2), the first table retracting device comprises a first movable member which is movable in the direction parallel to the table guide, at least one first-movable-member-related engaging device and a plurality of first engageable portions each of which is disengageably engageable with the at least one first-movable-member engaging device, one of (a) the first movable member and (b) the at least two tables of the first table group supporting the at least one first-movable-member-related engaging device, the other of (a) the first movable member and (b) the at least two tables of the first table group supporting the plurality of first engageable portions, and a first moving device which moves the first movable member within a first composite area provided by the carrier-movement area and the first waiting area, and the second table retracting device comprises, a second movable member which is movable in the direction parallel to the table guide, at least one second-movable-member-related engaging device and a plurality of second engageable portions each of which is disengageably engageable with the at least one second-movable-member engaging device, one of (a) the second movable member and (b) the at least two tables of the second table group supporting the at least one second-movable-member-related engaging device, the other of (a) the second movable member and (b) the at least two tables of the second table group including the plurality of second engageable portions, and a second moving device which moves the second movable member within a second composite area provided by the carrier-movement area and the second waiting area. In the present apparatus, the tables are engaged with the movable members when the engaging devices are engaged with the engageable portions, and the tables are moved with the movable members. The at least one first- or second-movable-member-related engaging device may be either a single engaging device, or the same number of engaging devices as the number of the tables, in the case where the engaging device or devices is or are supported by the first or second movable member. In the latter case, all the tables of the first or second table groups may be engaged with the first or second movable member via the engaging devices on the movable member and the engageable portions of the tables, so that all the tables may be moved from a component-supply ("CS") area to the first or second waiting area, or from the waiting area to the CS area. The movable-member-related engaging devices and the engageable portions may function for positioning the tables being not engaged with the carriers, relative to the bed. In this case, one or more exclusive table positioning devices may not be employed. In the above-indicated former case, each of the tables of the first or second group can be retracted to the first or second waiting area, by iteratively reciprocating the first or second movable member between the CM area and the first or second waiting area. In this case, it is preferred that one or more exclusive table positioning devices be provided for positioning, relative to the bed, the table or tables which waits or wait in the first or second waiting area, for preventing undesirable movements of the tables in the waiting area. In the case where the tables support the first- and second-movable-member-related engaging devices, respectively, those engaging devices may also function as the carrier-related engaging devices for engaging the tables and the carriers with each other. In this case, the total number of the engaging devices is reduced. On the other hand, in the case where the movable-member-related engaging devices and the engageable portions engageable therewith may be provided independent of the carrier-related engaging devices and the engageable portions engageable therewith. In this case, the movable-member-related engaging devices can be engaged with, and disengaged from, the engageable portions therefor while simultaneously the carrier-related engaging devices are engaged with, and disengaged from, the engageable portions therefor. In the case where the tables support the first- and second-movable-member-related engaging devices, respectively, the first or second movable member may include only a single engageable portion which is engageable with each of the first- or second-movable-member-related engaging devices.

(4) According to a fourth feature of the invention which includes the third feature (3), the first moving device comprises a plurality of first rotatable members which are provided at opposite ends of the first composite area and each of which is rotatable about an axis line extending in a direction perpendicular to the table guide, at least one first wound-on member which is wound on the first rotatable members so as to connect the first rotatable members and extend parallel to the table guide, and a first drive device which rotates at least one of the first rotatable members, the first movable member being connected to a portion of the first wound-on member, and wherein the second moving device comprises a plurality of second rotatable members which are provided at opposite ends of the second composite area and each of which is rotatable about an axis line extending in a direction perpendicular to the table guide, a second wound-on member which is wound on the second rotatable members so as to connect the second rotatable members and extend parallel to the table guide, and a second drive device which rotates one of the second rotatable members, the second movable member being connected to a portion of the second wound-on member. In the present apparatus, the first or second movable member is moved, and the tables are moved, when the first or second rotatable members are rotated and the first or second wound-on member is moved or circulated. The first or second rotatable members may be timing pulleys, V-type pulleys, sprockets, or the like, and the first or second wound-one member may be a timing (cog) belt, a V-type belt, a chain, or the like. The first or second drive device may include a servomotor as a drive source. However, it is not essentially needed to employ, as the drive source, a servomotor or any other electric motor whose rotation angle can be controlled with accuracy. A common electric motor can be employed as the drive source. The accuracy with which the tables are stopped in the first or second waiting area may be lower than that with which the tables are stopped in the CM area for supplying ECs, and the first or second moving device may be provided by the first or second rotatable members, the first or second wound-on member, and the first and second drive device. Thus, the first or second table retracting device may be produced at low cost.

(5) According to a fifth feature of the invention which includes any one of the first to fourth features (1) to (4), the EC supplying apparatus further comprises a component-supply control device which controls the carriers, the carrier-related engaging devices, and the first and second table retracting devices in a single-group mode in which the at least one table of one of the first and second groups iteratively carries out a first sequence of movements for supplying electronic components while the at least one table of the other group is not moved, and a two-group mode in which the tables of both of the first and second groups iteratively carry out a second sequence of movements for supplying electronic components. The single-group mode may be a first mode in which the sorts of ECs supplied by the first table group are the same as those of ECs supplied by the second table group, or a second mode in which at least one of the sorts of ECs supplied by the first table group is different from the sorts of ECs supplied by the second table group. In the second mode, the above-indicated other table group may wait in the corresponding waiting area for a long time in some cases, or for a short time in other cases. In the case where the one table group supplies ECs for being mounted on each of a number of successive PCBs of a same sort, the other table group waits for a long time, thereby allowing an operator to change the cartridges with other cartridges or replenishing the cartridges with ECs. On the other hand, in the case where ECs are supplied for being mounted alternately on a PCB of a first and on a PCB of a second sort or alternately on a first predetermined number of PCBs of a first sort and on a second predetermined number of PCBs of a second sort, the first and second table groups are frequently changed with each other corresponding to the alternate change of the first and second sorts of the PCBs. Thus, the other table group waits for a short time. In the two-group mode, ECs can be supplied by using the tables of the two groups, i.e., using the greater number of cartridges than the number of cartridges that can be supported by the tables of only one group.

(6) According to a sixth feature of the invention which includes any one of the first to fifth features (1) to (5), the EC supplying apparatus further comprises a carrier control device which controls the carriers such that one of the tables iteratively moves and stops for supplying electronic components and another of the tables follows the one table at an acceleration whose absolute value is smaller than that of an acceleration of the one table and at a deceleration whose absolute value is smaller than that of a deceleration of the one table. In the present apparatus, since the next table which is for next supplying ECs follows the current table which is currently supplying ECs, the next table is moving near the current table and can immediately start supplying ECs, when the current table completes the supplying of the last EC. That is, the current table can be changed with the next table in a very short time. Regarding an EC supplying apparatus which is appropriately designed and produced, this time can be shortened to such a time which is approximate to the time needed to change one cartridge with its adjacent cartridge on each table. In addition, since the next table is moved at acceleration and deceleration whose absolute values are smaller than those of acceleration and deceleration of the current table, the present apparatus produces only smaller vibration and lower noise as compared with an apparatus wherein two tables are moved as a unit at the same acceleration and deceleration.

(7) According to a seventh feature of the invention which includes any one of the first to sixth features (1) to (6), the at least one table guide commonly supports every one of the at least four tables. The present apparatus is advantageous in the case where each of the four or more tables need not pass by the other tables, because the total number of parts needed can be reduced and accordingly the present apparatus enjoys a simple construction.

(8) According to an eighth feature of the invention which includes any one of the first to seventh features (1) to (7), the EC supplying apparatus further comprises at least three carrier guides each of which guides a corresponding one of the at least three carriers and is associated with the corresponding one carrier exclusively. Since the carriers are supported by the carrier guides, respectively, the carriers can move without tilting even while they are not engaged with the tables. Therefore, the carrier-related engaging devices can engage the engageable portions with ease and with stability.

(9) According to a ninth feature of the invention which includes any one of the first to eighth features (1) to (8), the carrier-related engaging devices are provided on the carriers, respectively, and each of the carrier-related engaging devices is engageable with the engageable portion of at least one corresponding table of the tables. The total number of the carrier-related engaging devices respectively provided on the carriers is smaller than that of the engaging devices respectively provided on the tables, in the case where the total number of the carriers is smaller than that of the tables. This contributes to reducing the production cost of the present apparatus.

(10) According to a tenth feature of the invention which includes any one of the first to ninth features (1) to (9), the first table group includes a same number of tables as a number of the tables of the second table group, and each of the first and second table retracting devices retracts the tables of a corresponding one of the first and second table groups, to a corresponding one of the first and second waiting areas. In the case where the four or more, even number of tables are divided into two groups each having the same number of tables, the first and second waiting areas may have the same length in the direction of moving of the tables, and the first and second table retracting devices may have the same construction. For example, the first and second movable members may have the same length, the respective numbers of the first- and second-movable-member-related engaging devices may be equal to each other, and the respective driving forces of the drive sources of the first and second moving devices may be equal to each other. Thus, the first and second retracting devices can be assembled from common parts and accordingly can be produced at low cost and with ease. In addition, the present EC supplying apparatus may be designed as being symmetrical with respect to a component-supply position corresponding to the middle position of the CM area. This contributes to designing the present apparatus with ease.

(11) According to an eleventh feature of the invention which includes any one of the third to tenth features (3) to (10), the first table retracting device further comprises a first guide which guides the first movable member and is associated therewith exclusively, and the second table retracting device further comprises a second guide which guides the second movable member and is associated therewith exclusively, the first guide extends over the first waiting area and at least a portion of the carrier-movement area, and the second guide extends over the second waiting area and at least a portion of the carrier-movement area. Since the first or second table retracting device is required to move the first or second movable member for retracting the tables to the first or second waiting area but is not required to move the movable member over the entirety of the CM area, the length of the first or second guide may be shorter than the sum of respective lengths of the first or second waiting area and the CM area.

(12) According to a twelfth feature of the invention which includes the eleventh feature (11), the first guide extends over the first waiting area and an entirety of the carrier-movement area, and the second guide extends over the second waiting area and an entirety of the carrier-movement area. In the present apparatus, the first or second movable member is movable within the entire CM area, and can retract each table from any position in the CM area to the first or second waiting area.

(13) According to a thirteenth feature of the present invention, there is provided a method of supplying electronic components, comprising the steps of preparing (a) at least four tables each of which is movable, by being guided by at least one common linear guide, in a table-movement area including at least one waiting area and a carrier-movement area in series, (b) at least three carriers each one of which is movable, independent of the other carriers, in a direction parallel to the linear guide, and is passable by the other carriers, and (c) a plurality of electronic-component supplying cartridges each of which stores a number of electronic components of a sort and includes a component-supply portion from which the electronic components are supplied one by one, placing, on each of the at least four tables, at least two electronic-component supplying cartridges of the plurality of electronic-component supplying cartridges, such that the respective component-supply portions of the at least two electronic-component supplying cartridges are arranged along a straight line, and engaging at least three tables of the at least four tables with the at least three carriers, respectively, while keeping the remaining at least one table within the waiting area, and iteratively moving and stopping a first carrier of the at least three carriers within the carrier-movement area, while positioning the component-supply portion of each of the cartridges on the table engaged with the first carrier, at a component-supply position where the each cartridge supplies at least one electronic component from the component-supply portion thereof, and simultaneously moving a second carrier of the remaining carriers, in a manner different from a manner in which the first carrier is moved and stopped, thereby moving the table engaged with the second carrier to replace the table engaged with the first carrier.

(14) According to a fourteenth feature of the invention which includes the thirteenth feature (13), the step of moving the table engaged with the second carrier to replace the table engaged with the first carrier comprises moving the table engaged with the second carrier to follow the table engaged with the first carrier, at an acceleration whose absolute value is smaller than that of an acceleration of the first table and a deceleration whose absolute value is smaller than that of a deceleration of the first table.

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which.

DETAILED DESCRIPTION OF THE PREFERRED EMBODIMENTS

There will be described an electronic-component ("EC") mounting system including an EC supplying apparatus embodying the present invention.

Figure 1:
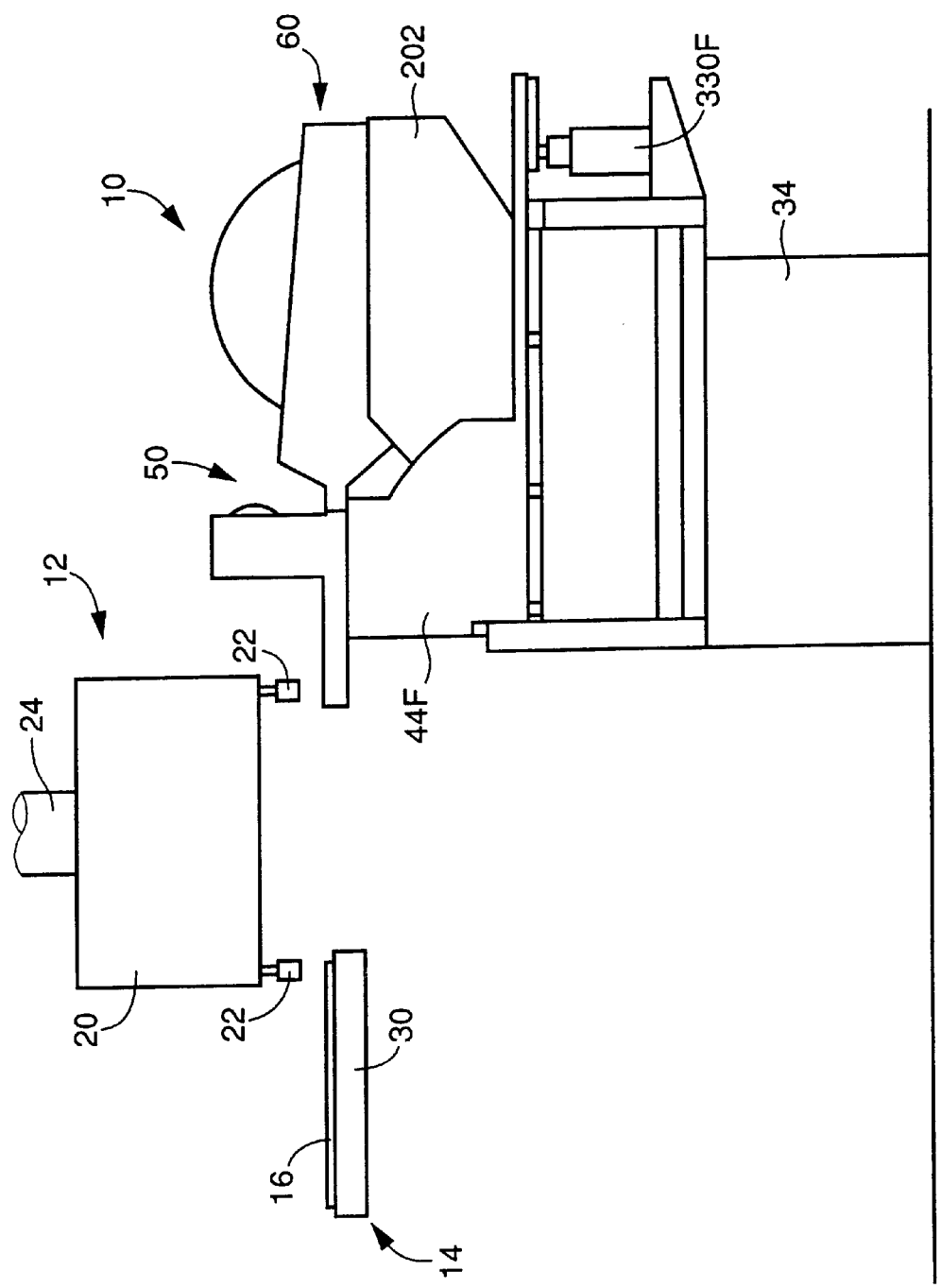
FIG. 1 is an elevation view of an electronic-component ("EC") mounting system including an EC supplying apparatus embodying the present invention.

In FIG. 1, reference numeral 10 designates the EC supplying apparatus, which supplies ECs to an EC mounting apparatus 12 which in turn mounts the ECs on a printed circuit board ("PCB") 16 which is positioned and supported by a PCB positioning and supporting apparatus 14.

Figure 20:
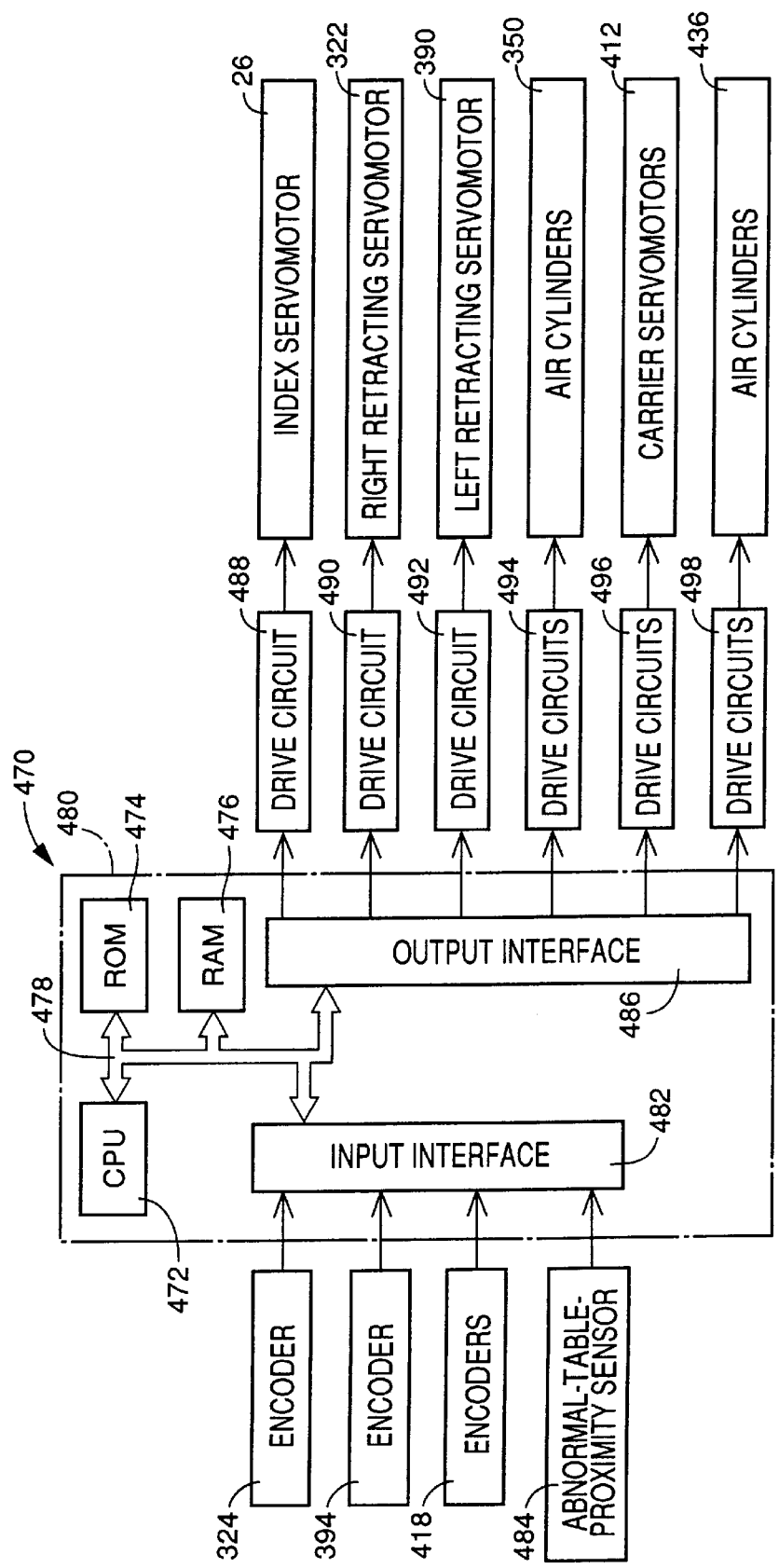
FIG. 20 is a block diagram illustrating an essential portion of a control device employed by the EC mounting apparatus of FIG. 1.

The EC mounting apparatus 12 includes an index table 20 as a rotatable body which is intermittently rotatable about a vertical axis line. The index table 20 includes a plurality of component sucking heads 22 (e.g., twelve heads 22, but only two heads 22 are shown in the figure) as component holding heads, and is intermittently rotated by an intermittently rotating device (not shown), as a component-holding-head moving device, which is driven by an index servomotor 26 (FIG. 20). The rotation of the index servomotor 26 is transmitted to a rotatable axis member 24 fixed to the index table 20, by a motion transmitting device provided by a cam, a cam follower, etc. (not shown). As the index table 20 is intermittently rotated, each of the twelve component sucking heads 22 is sequentially moved to a component sucking position, a component-posture detecting position, a component-posture correcting position, a component mounting position, etc., in the order of description. A head elevating and lowering device (not shown) for elevating and lowering each component sucking head 22 is provided at each of the component sucking and mounting positions. More specifically described, the rotation of the index servomotor 26 is converted by a motion converting device provided by a cam, a cam follower, etc. (not shown) into an upward and a downward movement of an elevator member (not shown), and each head 22 is elevated and lowered with the upward and downward movements of the elevator member.

The PCB positioning and supporting apparatus 14 includes a PCB support table 30 for positioning and supporting the PCB 16. The PCB support table 30 is provided on an X-Y table (not shown) which is movable in an X direction (i.e., direction perpendicular to the plane of the drawing of FIG. 1) and a Y direction (i.e., direction from the right-hand side toward the left-hand side) perpendicular to the X direction in a horizontal plane. As the X-Y table is moved, the PCB 16 is moved to any desired position in the horizontal plane. The PCB 16 is fed in onto, and out of, the PCB support table 30 in the X direction by a feeding-in conveyor and a feeding-out conveyor (not shown). While the component sucking heads 22 which are holding the ECs are sequentially positioned one after another at the above-mentioned component mounting position, the PCB 16 is consecutively moved by the X-Y table so that predetermined locations on the PCB 16 are sequentially positioned one after another at the component mounting position and the ECs are mounted at the predetermined locations on the PCB 16, respectively.

Next, there will be described the EC supplying apparatus 10.

Figure 2:
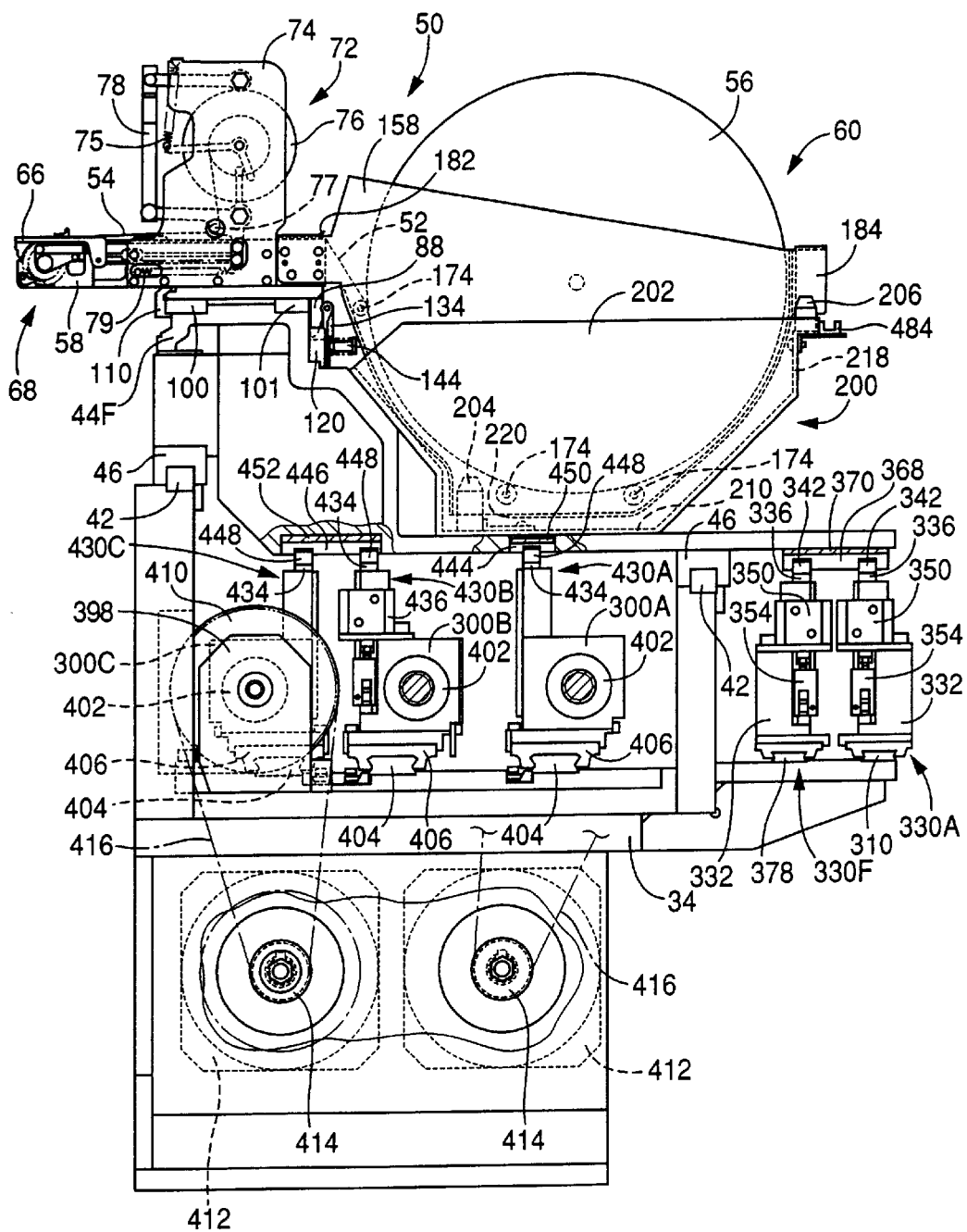
FIG. 2 is a partially cut away, side elevation view of the EC supplying apparatus of FIG. 1.
Figure 13:
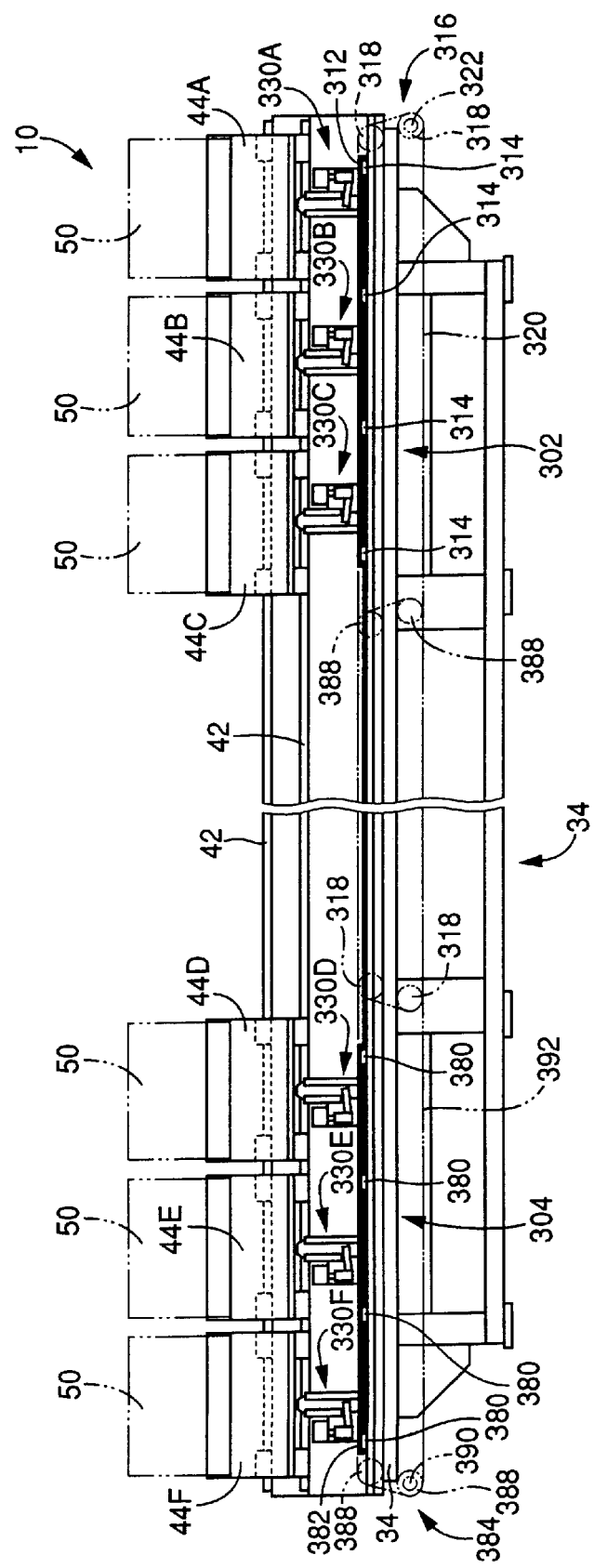
FIG. 13 is a front elevation view of the EC supplying apparatus of FIG. 1.
Figure 14:
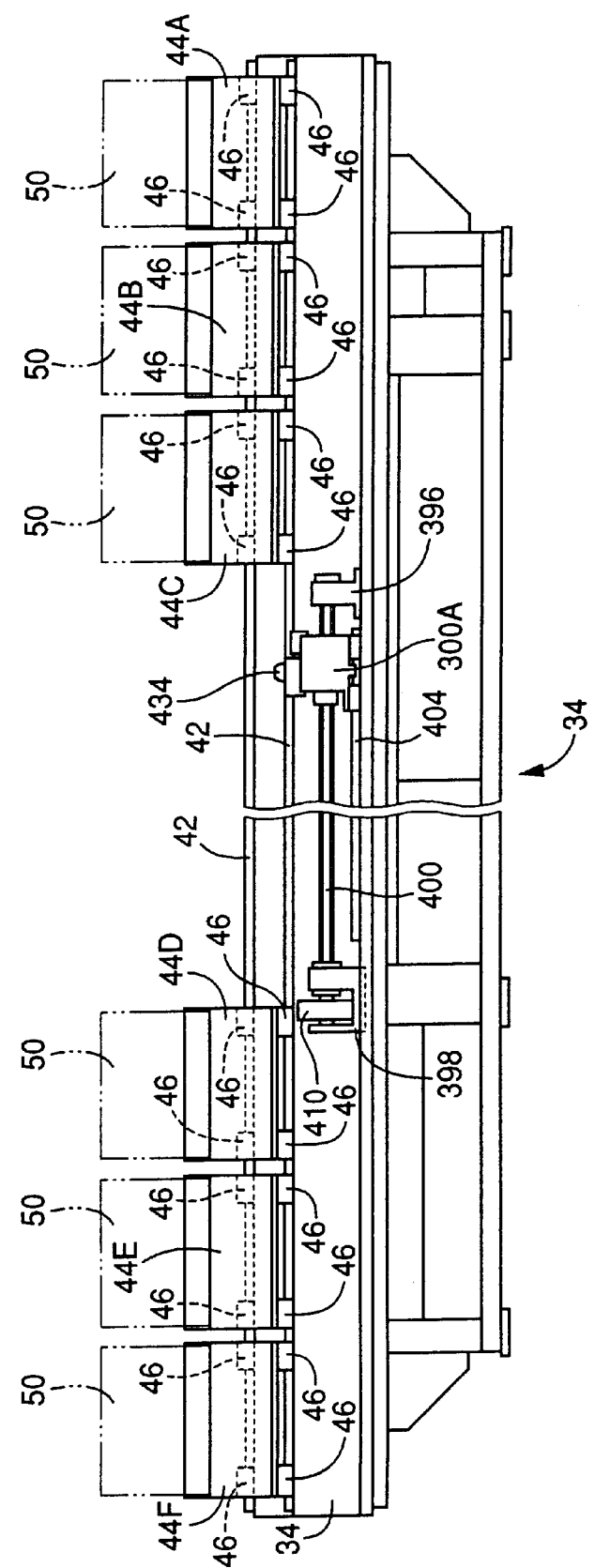
FIG. 14 is a front elevation view of the EC supplying apparatus of FIG. 1 including a carrier.
Figure 15:
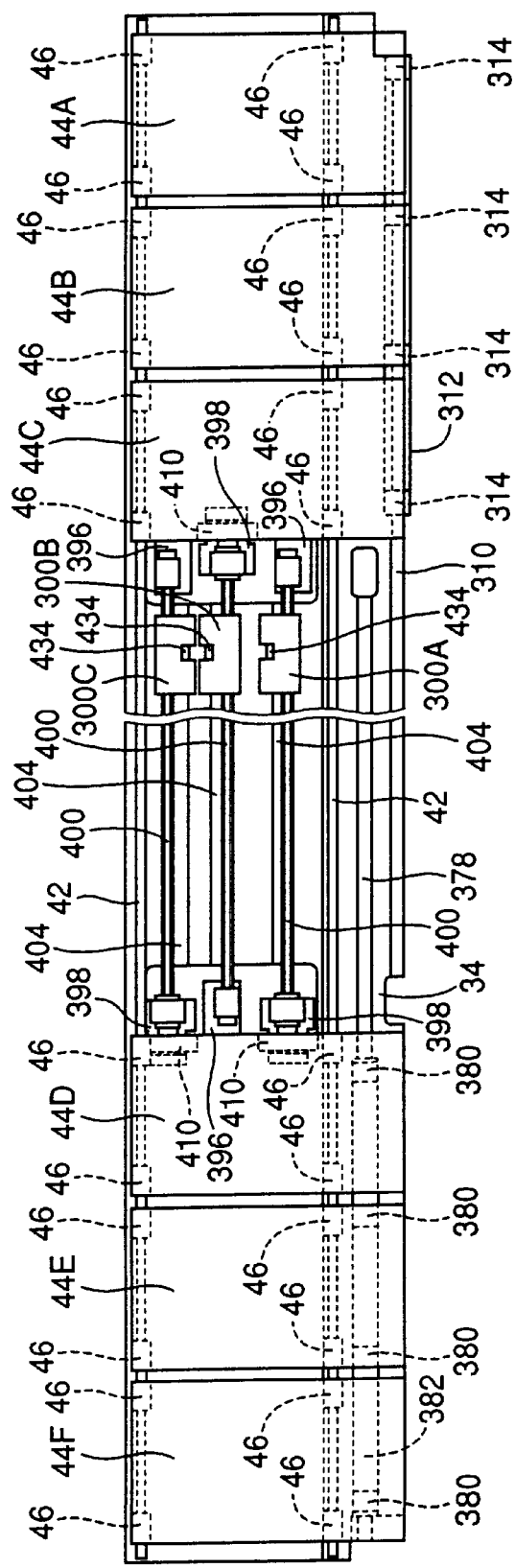
FIG. 15 is a plan view of the EC supplying apparatus of FIG. 14.

In FIG. 2, reference numeral 34 designates a bed. As shown in FIGS. 2 and 15, on the bed 34, there are provided a pair of linear rail-like table guides 42 as guide members. The two table guides 42 extend in the X direction and are spaced from each other in the Y direction. As shown in FIGS. 13, 14, and 15, the table guides 42 cooperate with each other to support six tables 44A, 44B, 44C, 44D, 44E, 44F such that each of the six tables 44A–44F is movable relative thereto. Each table 44A–44F has two fixed guide blocks 46, as guided members, which are spaced from each other in the Y direction and which fit on the two table guides 42, respectively, such that the guide blocks 46 are slideable on the table guides 42 being guided by the same 42.

Each table 44A–44F supports a plurality of EC supplying cartridges 50 (hereinafter, shortened to as the "cartridges" 50). As shown in FIG. 2, each cartridge 50 supplies the ECs in the form of an EC tape 52. The EC tape 52 includes a carrier tape (not shown) having a number of EC accommodating pockets which are equidistant from one another in the longitudinal direction thereof and each of which accommodates a single EC. The respective upper openings of the EC pockets of the carrier tape is covered with a cover tape 54. The EC tape 52 is wound around an EC supply reel 56, which is held by a reel holder 60 as an EC storing device. The reel holder 60 is fixed to a rear end portion of a cartridge main body 58 which is opposite to a front end portion of the same 58 on the side of the EC supplying apparatus 12. The rear end portion of the cartridge main body 58 corresponds to an upstream-side end of the same 58 in the direction of feeding of the EC tape 52 (hereinafter, referred to as the "EC feeding direction"). The reel holder 60 will be described in detail later.

The cartridge main bodies 58 each of which has a generally elongate, plate-like shape stand upright on each table 44A–44F such that the lengthwise and widthwise directions of each main body 58 are horizontal and the lengthwise direction is parallel to the Y direction. The EC tape 52 is placed on the upper surface of each main body 58, is covered with a cover member 66, and is intermittently fed by a feeding device 68, at a predetermined feeding pitch in the Y direction parallel to the lengthwise direction of the main body 58. Hereinafter, the lengthwise direction of each main body 58 will be referred to as the "front-rear direction" and the widthwise direction of the same will be referred to as the "left-right direction". The front-rear direction is parallel to the EC feeding direction.

The feeding device 68 intermittently feeds forward the EC tape 52 together with the cover member 66 and, when retracting rearward the cover member 66, does not feed forward the EC tape 52 and prepares for the next intermittent forward feeding of the EC tape 52 (that is, causes a ratchet pawl to climb over a tooth of a ratchet wheel).

A cover-film take-up device 72 is fixed to each cartridge main body 58 via a bracket 74. The take-up device 72 includes a take-up reel 76 which is not rotated, when the EC tape 52 is fed forward, but is rotated to take up the cover film 54 when the feeding device 68 prepares for a subsequent intermittent feeding of the EC tape 52.

Since the feeding of the EC tape 52 and the taking-up of the cover film 54 are not relevant to the present invention, those operations will be described briefly below.

The feeding device 68 and the cover-film take-up device 72 are driven by a drive device which in turn is driven by the index servomotor 26. The rotation of the servomotor 26 is converted by a motion converting device provided by a cam, a cam follower, etc. (not shown) into an upward and a downward movement of an elevator member (not shown), and the upward and downward movements of the elevator member cause a drive bar 78 as a drive member fixed to the bracket 74 to move upward and downward, thereby operating the feeding device 68 and the take-up device 72.

When the drive bar 78 is moved downward by the downward movement of the elevator member, the cover member 66 is retracted rearward and the feeding device 68 prepares for a subsequent intermittent feeding of the EC tape 52. Simultaneously, in the cover-film take-up device 72, the take-up reel 76 is rotated by the biasing force of a spring 75 as an elastic member so as to take up one-pitch length of the cover film 54 from the carrier tape. In addition, a movable guide roller 77 fixed to the drive bar 78 is rotated downward so that the distance between the roller 77 and the take-up reel 76 increases and a predetermined length of the cover film 54 is drawn up. On the other hand, when the elevator member is moved upward, the drive bar 78 is moved upward by the biasing force of a spring 79 as an elastic member so as to follow the upward movement of the elevator member. Thus, the feeding device 68 feeds the EC tape 52 forward by one feeding pitch, so that the leading one of the EC accommodating pockets from which the cover film 54 has been removed is moved to and positioned at a component-supply portion of the cartridge 50. During this, the take-up reel 76 of the cover-film take-up device 72 is not rotated and the guide roller 77 is rotated upward, so that the distance between the roller 77 and the reel 76 decreases and the predetermined length of the cover film 54 which had been drawn up is released. Thus, the one-pitch forward feeding of the EC tape 52 together with the cover member 66 is permitted. Since in this way the cover film 54 is not removed from the carrier tape during the time duration in which the EC tape 52 is being fed forward, the EC tape 52 is free from vibration which would otherwise result from the removing of the cover film 54. Thus, the ECs are effectively prevented from changing their postures (e.g., lying on their sides) in, or jumping out of, the EC accommodating pockets of the carrier tape.

Next, there will be described an attaching device for attaching each cartridge 50 to each table 44A–44F. An essential portion of each attaching device is provided on each table 44A–44F. There will be described one attaching device associated with the table 44F, as a representative of the other attaching devices, since all the attaching devices have the same construction.

Figure 3:
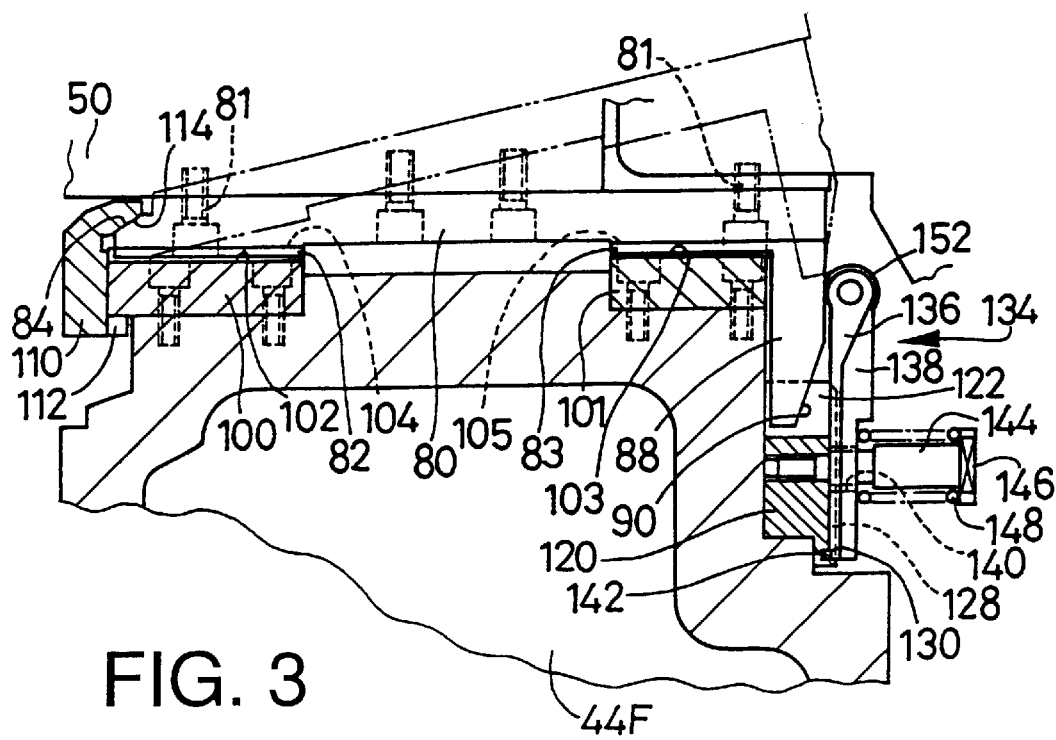
FIG. 3 is a cross section illustrating the manner in which an EC supplying cartridge of the EC supplying apparatus of FIG. 1 is attached to a table of the same.
Figure 4:
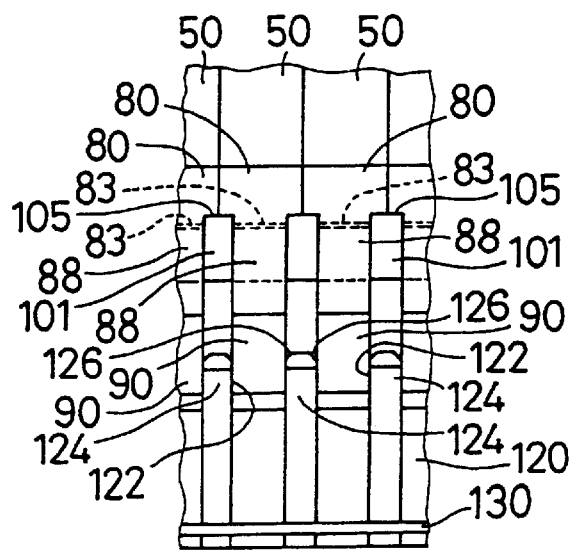
FIG. 4 is an elevation view illustrating the state in which the EC supplying cartridges are attached to the table from which engaging levers are omitted for illustrative purposes only.
Figure 5:
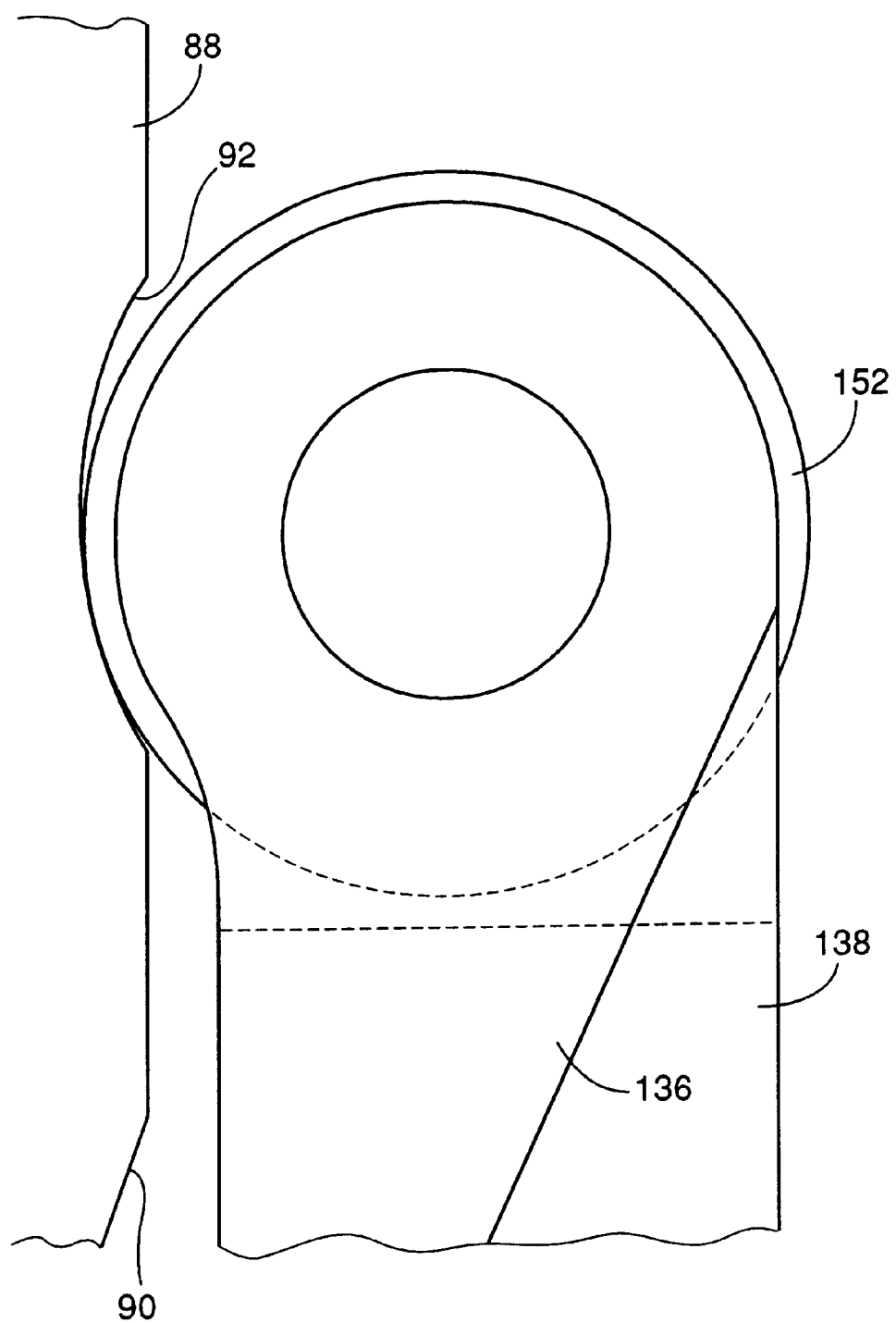
FIG. 5 is an elevation view illustrating the state in which the engaging lever is engaged with a second positioning projection of the EC supplying cartridge.

As shown in FIGS. 3 to 5, a plate-like fitting member 80 which has the same width as that of each cartridge main body 58 is fixed with bolts 81 to the lower surface of a main member of the main body 58, and cooperates with the main member to provide the main body 58. The main member is formed of an aluminum alloy to lighten the main body 58. On the other hand, the fitting member 80 is formed of a carbon steel for machine structural use, S50C, and is quenched. First positioning projections 82, 83 project from two locations on the fitting member 80 which are spaced from each other in the front-rear direction of the cartridge 50. The first positioning projections 82, 83 have a rectangular cross section and, as shown in FIG. 4, have a width smaller than that of the fitting member 80, and project from an intermediate portion of the fitting member 80 in the widthwise direction of the same 80.

The fitting member 80 has, at the front end portion thereof, an inclined upper surface 84 which is inclined frontward and downward, i.e., rearward and upward. The fitting member 80 has a second positioning projection 88 projecting downward from the rear end portion thereof. The second positioning projection 88 is provided by a plate-like member having the same width as that of the first positioning projection 83. The second projection 88 projects normally from the fitting member 80 in a direction opposite to the direction in which the main member of the main body 58 extends. As shown in FIG. 5, the second projection 88 has, in an intermediate portion thereof in the direction of projection thereof from the fitting member 80, a part-cylindrical surface 92 whose center line is parallel to the widthwise direction of the cartridge 50. The part-cylindrical surface 92 provides an engaging surface which is concave in the frontward direction of the cartridge 50. As shown in FIG. 3, the second projection 88 also has, at the lower end portion thereof, an inclined guide surface 90 which is inclined frontward and downward, i.e., rearward and upward.

The table 44F includes a main member formed of an aluminum alloy, and a first and a second cartridge positioning plate 100, 101 which extend in the Y direction and which are fixed at a front and a rear location, respectively, on the upper surface of the main member. Like the fitting member 80, the positioning plates 100, 101 are formed of a carbon steel for machine structural use, S50C, and are quenched. The two positioning plates 100, 101 have first positioning grooves 102, 103, respectively, which extend in the Y direction. The table 44F has a plurality of first positioning grooves 102, and a plurality of first positioning grooves 103, which are arranged in the X direction at a pitch equal to the pitch at which a plurality of cartridges 50 are attached to the table 44F. The first grooves 102, 103 have a width slightly larger than that of the first projections 82, 83, and has a depth larger than the length of projection of the same 82, 83. Thus, the respective upper surfaces of the two positioning plates 100, 101 provide two support surfaces 104, 105 for supporting cartridges 50.

Figure 6:
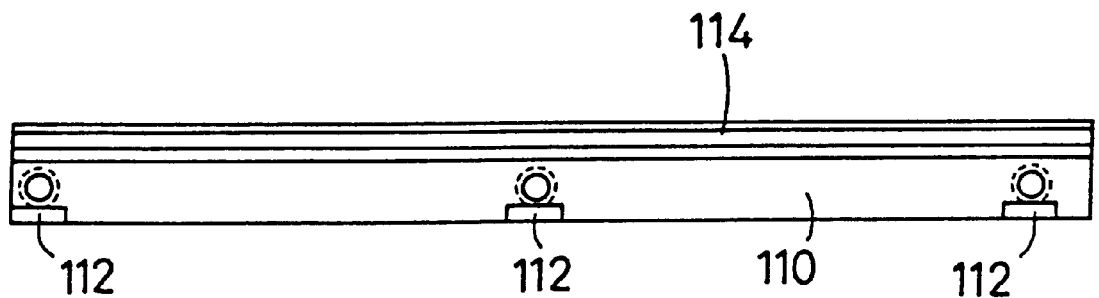
FIG. 6 is a front elevation view of a stopper plate which is attached to the table.
Figure 7:
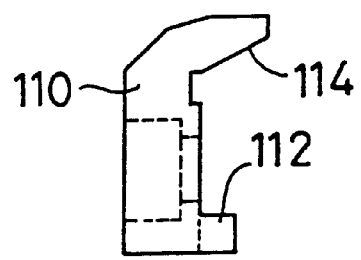
FIG. 7 is a side elevation view of the stopper plate of FIG. 6.

The table 44F includes a stopper plate 110 which is formed of carbon steel S50C and is quenched and which is fixed to the respective front and upper end faces of the main members of the table 44F. As shown in FIGS. 6 and 7, the stopper plate 110 is provided by a plate-like member having substantially the same length as a length of the table 44F in the X direction. The stopper plate 110 has three engaging projections 112 which project from three locations on a lower end portion of one side surface of the plate 110 that are spaced from one another in the lengthwise direction of the plate 110. The stopper plate 110 is fixed with bolts (not shown) to the three first cartridge positioning plates 100, with the three projections 112 being engaged with the respective lower surfaces of those plates 100.

The upper portion of the stopper plate 110 projects upward over the respective upper surfaces of the first cartridge positioning plates 100, and hangs over the respective front end portions of the plates 100. The hanging portion of the stopper plate 100 has an inclined lower surface 114 which is inclined frontward and downward, i.e., rearward and upward and thus corresponds to the respective inclined upper surfaces 84 of the cartridges 50.

Figure 8:
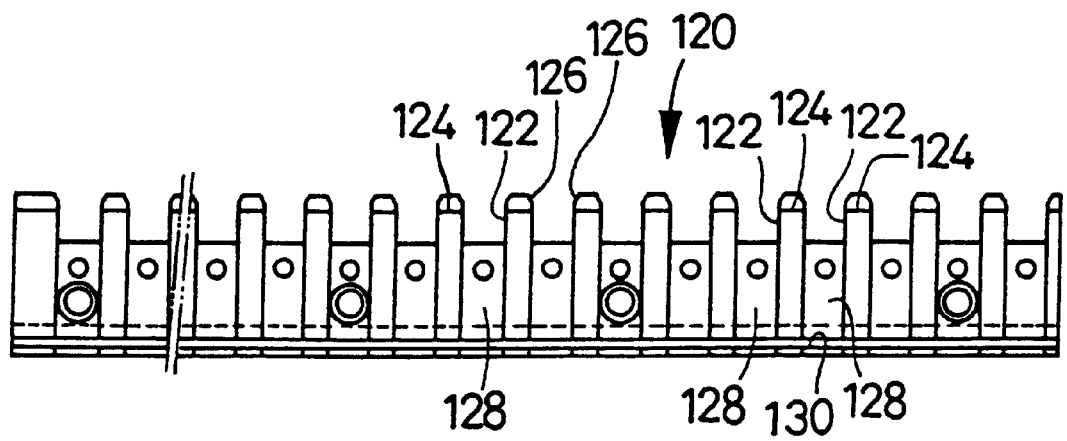
FIG. 8 is a front elevation view of a cartridge positioning plate which is attached the table.
Figure 9:
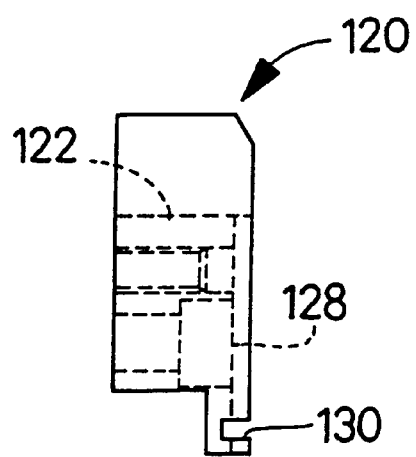
FIG. 9 is a side elevation view of the cartridge positioning plate of FIG. 8.

As shown in FIGS. 3 and 4, a third cartridge positioning plate 120 other than the first and second plates 100, 101 is fixed to a lower portion of a rear end face of the table 44F that is lower than the support surface 105. The third plate 120 is also formed of carbon steel S50C and is quenched. As shown in FIGS. 8 and 9, the third plate 120 has, at an upper portion thereof, a plurality of second positioning grooves 122 which are arranged at a pitch equal to the pitch at which the cartridges 50 are attached to the table 44F. The second grooves 122 have a width slightly larger than that of the second positioning projection 88, and extend in the direction of thickness of the third plate 120 (i.e., in the Y direction). Each second groove 122 is defined by two adjacent walls 124, and the distance between the two adjacent walls 124 increases at their upper end portions because each wall 124 has a pair of inclined guide surfaces 126 at its upper end portion.

As shown in FIG. 3, the third plate 120 has, at the rear portion thereof, a plurality of fitting grooves 128 which extend vertically and have the same width as that of the second grooves 122. In addition, the third plate 120 has, at the lower portion thereof, an engaging groove 130 which extends in the lengthwise direction thereof.

Figure 10:
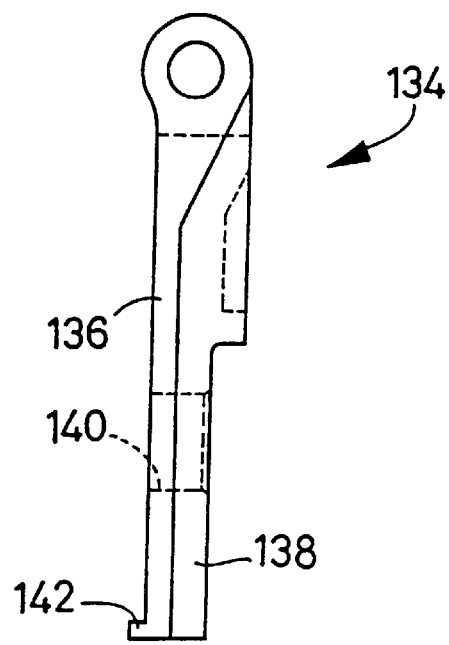
FIG. 10 is a side elevation view of the engaging lever which is attached to the cartridge positioning plate of FIG. 8.
Figure 11:
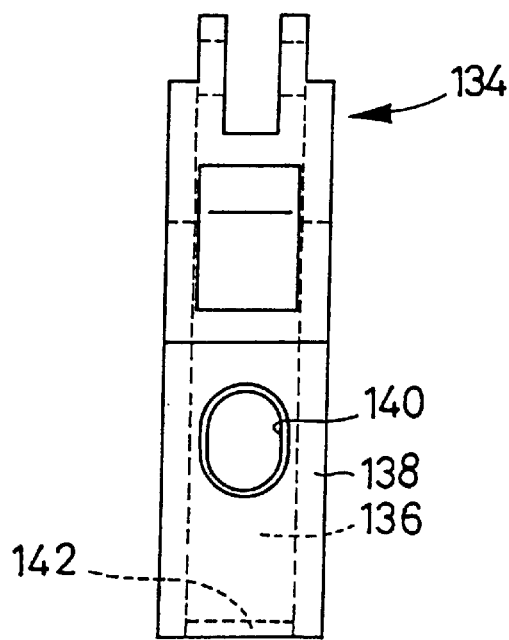
FIG. 11 is a front elevation view of the engaging lever of FIG. 10.

A rotatable engaging lever 134 is fitable in each fitting groove 128. The lever 134 has a width slightly smaller than that of the fitting groove 128, and includes a fitting portion 136 which is fitable in the fitting groove 128 and a wide portion 138 having a width which is greater than that of the fitting portion 136 and is smaller than the pitch at which the cartridges 50 are attached to the table 44F. As shown in FIGS. 10 and 11, the engaging lever 134 has, in the lower portion thereof, an elongate hole 140 which extends in the lengthwise direction thereof, and includes an engaging projection 142 projecting from the lower end thereof.

As shown in FIG. 3, a screw member 144 is provided in each fitting groove 128, and extends through the elongate hole 140 of the engaging lever 134. A coil spring 148 as an elastic member functioning as a biasing member is provided between the lever 134 and a large-diameter head portion 146 of the screw member 144, so as to bias the lever 134 in a direction in which the fitting portion 136 of the lever 134 fits in the fitting groove 128 and the engaging projection 142 engages the engaging groove 130. Thus, the engaging lever 134 is prevented from being moved out of position in the X direction or the vertical direction (i.e., Z direction).

As shown in FIG. 3, the engaging lever 134 has, at the upper end portion thereof, a roller 152 which is rotatable about an axis line parallel to the X direction. As shown in FIG. 5, the roller 152 has a radius of curvature smaller than that of the engaging surface 92 of the second positioning projection 88.

Next, there will be described the reel holder 60.

As shown in FIG. 2, the reel holder 60 includes a small-width, container-like reel receiver 158 having a shape corresponding to more than half a polygon containing the outer circle of the supply reel 56. The reel receiver 158 is provided by a first and a second thin plate fixed to each other, and has a pair of side walls parallel to each other, a front, a bottom, and a rear wall which connects the two side walls, and an upper opening.

Three support rollers 174, each of which is rotatable about an axis line parallel to the widthwise direction of the cartridge main body 58, are provided in the inner space of the reel receiver 158. The supply reel 56, received in the reel receiver 158, is rotatably supported by the three support rollers 174. The reel receiver 158 is fixed to the main body 58, and has a tape guide 182 which covers the rear end portion of the upper surface of the main body 58. Thus, the EC tape 52 drawn from the supply reel 56 is fed between the main body 58 and the tape guide 182. The reel receiver 158 includes an engaging portion 184 which projects from the rear end face thereof in a direction parallel to the side walls thereof.

Each reel holder 60 is supported by a reel-holder-vibration preventing device 200 which is provided at the rear end portion of each table 44A–44F. Since all the preventing devices 200 have the same construction, there will be described one preventing device 200 provided on the table 44F, as a representative of the other devices 200.

The reel-holder-vibration preventing device 200 includes a bucket 202 fixed to the table 44F, and two reel-holder restrictors 204, 206 which are provided in a front and a rear portion of the bucket 202, respectively. The bucket 202 is open upward, and has a container-like shape having a length which assures that the bucket 202 receives a predetermined number of reel holders 60 of the cartridges 50 attached to the table 44F. The bucket 202 is fixed to the table 44F such that the lengthwise direction of the bucket 202 is parallel to the X direction.

Figure 12:
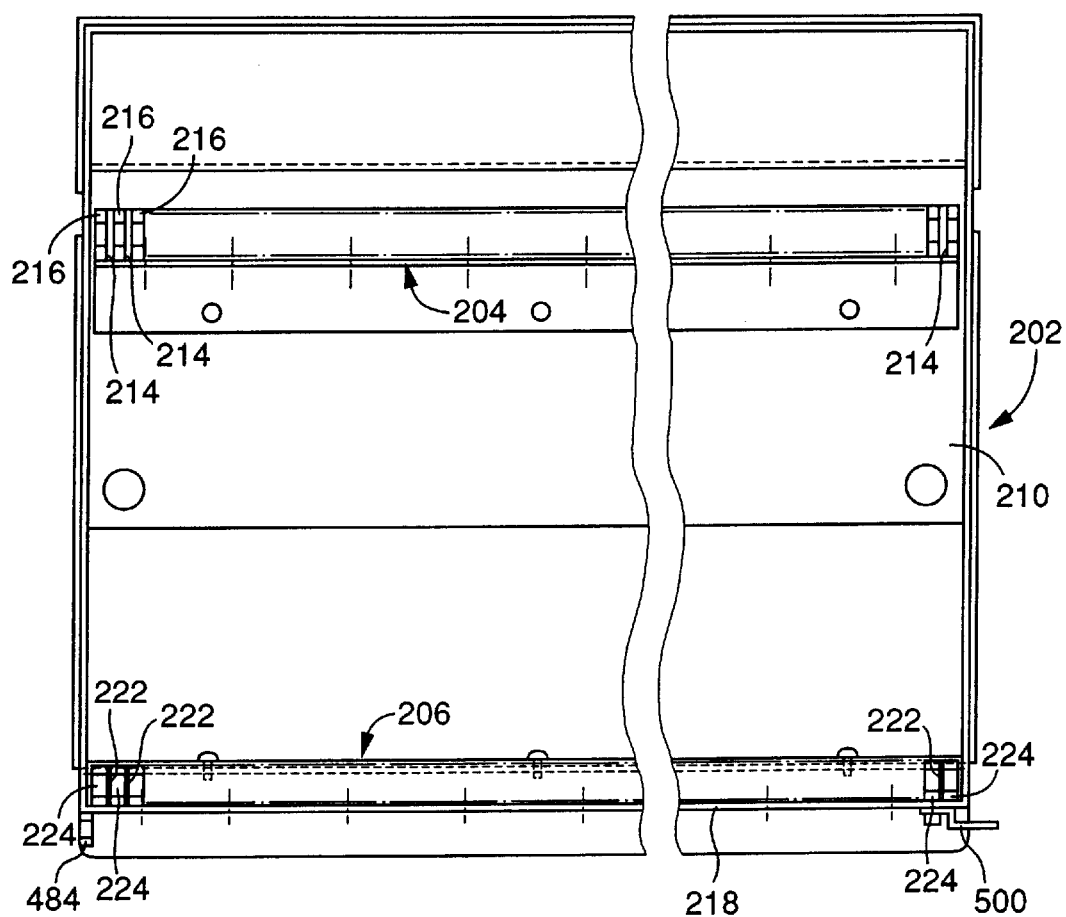
FIG. 12 is a plan view of a reel-holder-vibration preventing device which prevents vibration of a reel holder of the cartridge.

The front restrictor 204 is provided by an elongate thick plate, and is fixed to the front portion of the upper surface of a bottom wall 210 of the bucket 202 such that the restrictor 204 extends parallel to the X direction. As shown in FIG. 12, the front restrictor 204 has a number of fitting grooves 214 which extend in the front-rear direction of the bucket 202 and which are equidistant from one another in the X direction. Each fitting groove 214 has a width slightly larger than twice the thickness of one side wall of the reel receiver 158, and is defined by two adjacent walls 216 each of which has a width or thickness slightly smaller than the distance between respective inner surfaces of the two side walls of the reel receiver 158. Each reel receiver 158 has, in a front portion of the bottom wall thereof, a recess 220 (FIG. 2) which has a width equal to the distance between the respective inner surfaces of the two side walls of the reel receiver 158. The recess 220 is engageable with each of the walls 216. Each wall 216 has a pair of inclined guide surfaces (not shown) like the guide surfaces 126 of each wall 124 of the third positioning plate 120.

As shown in FIG. 2, the rear restrictor 206 is fixed to a rear wall 218 of the bucket 202. Like the front restrictor 204, the rear restrictor 206 is provided by an elongate thick plate, and is fixed to the bucket 202 such that the restrictor 206 extends in the X direction. As shown in FIG. 12, the rear restrictor 206 has a number of fitting grooves 222 which extend in the front-rear direction of the bucket 202 and which are equidistant from one another in the X direction. Each fitting groove 222 has a width slightly larger than the thickness of the engageable portion 184 of the reel receiver 158, and is defined by two adjacent walls 224. Like each wall 216, each wall 224 has a pair of inclined guide surfaces (not shown) like the guide surfaces 126 of each wall 124 of the third positioning plate 120.

When each cartridge 50 is attached to the table 44F, first, the cartridge 50 is tilted such that the front portion thereof is lower than the rear portion thereof and, subsequently, the front end portion of the front first positioning projection 82 of the fitting member 80 is fit in the first positioning groove 102 and is advanced till the inclined upper surface 84 of the cartridge 50 contacts the inclined lower surface 114 of the table 44F.

Then, as indicated at two-dot chain line in FIG. 3, with the inclined upper surface 84 contacting the inclined lower surface 114, the cartridge 50 is placed down on the support surfaces 105. Since the first positioning projection 82 has the rectangular cross section and the front end portion thereof is fit in the first positioning groove 102, just placing down the cartridge 50 on the support surfaces 105 results in fitting the rear first positioning projection 83 in the rear first positioning groove 103.

Simultaneously, the guide surface 90 of the second positioning projection 88 contacts the roller 152 of the engaging lever 134. Since the guide surface 90 is inclined, the roller 152 is rotated in a direction in which the lever 134 is moved away from the projection 88 against the biasing action of the coil spring 148, as the projection 88 enters between the lever 134 and the table 44F.

Thus, the inclined upper surface 84 of the cartridge 50 is held in contact with the inclined lower surface 114 of the table 44F, the two first positioning projections 82, 83 are fit in the two first positioning grooves 102, 103, respectively, and the cartridge 50 is placed on the support surfaces 104, 105. In this state, the lower end portion of the second positioning projection 88 that has the guide surface 90 is fit in one of the second positioning grooves 122, and the engaging surface 92 of the second projection 88 is engaged with the roller 152 of the lever 134 so that the second projection 88 is biased by the coil spring 148 via the lever 134.

The engaging surface 92 is the part-cylindrical surface. Therefore, as the second positioning projection 88 enters, first, the engaging lever 134 is rotated in a direction in which the lever 134 is away from the table 44F and, when the engaging surface 92 is opposed to the roller 152, the lever 134 is rotated toward the projection 88 so that the engaging surface 92 is neatly engaged with the roller 152. Thus, an operator can feel that the cartridge 50 has just been attached to the table 44F.

The upper inclined surface 84 of the cartridge 50 is advanced toward the lower inclined surface 114 of the table 44F because of the biasing force of the coil spring 148, and the front end portion of the cartridge 50 is pressed against the stopper plate 110 because of the inclination of the two surfaces 84, 114. Simultaneously, since the engaging surface 92 is lower than the support surfaces 104, the cartridge 50 is subject to an angular momentum which has its center at the contact point where the two surfaces 84, 114 contact each other and has a magnitude equal to the product of the biasing force of the coil spring and the distance between the contact point and the engagement point where the engaging surface 92 engages the roller 152 in the direction normal to the support surfaces 104, 105. Because of this angular momentum, the rear portion of the fitting member 80 opposite to the front portion of the same 80 with the inclined surface 84 is pressed on the rear support surfaces 105.

In addition, the engaging surface 92 is the part-cylindrical surface, and the radius of curvature of the same 92 is larger than the radius of the roller 152. Since the roller 152 engages a lower portion of the engaging surface 92 which is inclined rearward and downward, the cartridge 50 receives a downward force from the roller 152, so that the rear portion of the fitting member 80 is pressed on the rear support surfaces 105. In this way, both the front and rear portions of the cartridge 50 are positively pressed against the table 44F, and the cartridge 50 is effectively prevented from coming off the table 44F.

The engaging lever 134, the coil spring 148, and the second positioning projection 88 cooperate with one another to provide a cartridge pressing device which presses the cartridge 50 on the table 44F. The cartridge pressing device cooperates with the two inclined surfaces 84, 114 to provide the cartridge attaching device which attaches the cartridge 50 to the table 44F.

Moreover, the cartridge 50 is attached to the table 44F with the first positioning projections 82, 83 being fit in the first positioning grooves 102, 103 and with the second positioning projection 88 being fit in one second positioning groove 122. Thus, the cartridge 50 is prevented from moving in the left-right direction thereof at two locations which are spaced from each other in the vertical direction. Thus, the first and second positioning projections 82, 83, 88 and the first and second positioning grooves 102, 103, 122 cooperate with one another to provide a cartridge positioning device which positions the cartridge 50 relative to the table 44F in the widthwise direction of the cartridge 50. Therefore, although the cartridge 50 has a considerably small width, the cartridge 50 can keep its upright posture on the table 44F. In addition, when the table 44F is moved to bring the cartridge 50 or another cartridge 50 to the component supplying position, the cartridge 50 is effectively prevented from being laid on its side, even though the cartridge 50 may be subjected to an angular momentum which may result from the inertia thereof and may act thereon in a direction in which to lay it down. Accordingly, the amount of misalignment of the component-supply position provided on the top of the cartridge 50 in the X direction is minimized, and the EC supplying apparatus 12 can supply the ECs to the EC mounting apparatus 12 with high accuracy.

When the cartridge 50 is attached to the table 44F, the recess 220 provided in the bottom wall of the reel receiver 158 is engaged with one wall 216 of the table 44F and the pair of side walls of the reel receiver 158 are fit in two fitting grooves 222 on both sides of that one wall 216. Simultaneously, the engaging portion 184 of the reel receiver 158 is fit in one fitting groove 222 of the reel-holder restrictor 206. The fitting of the side walls of the receiver 158 in two fitting grooves 214 is guided by the pair of inclined surfaces provided on the top of the above-indicated one wall 216, and the fitting of the engaging portion 184 of the receiver 158 in one fitting groove 222 is guided by the respective inclined surfaces of two walls 224 on both sides of that one fitting groove 222.

The reel receiver 158 is prevented from moving in the widthwise direction thereof because of the engaging of the bottom wall thereof with one wall 216 and the fitting of the engaging portion 184 in one fitting groove 222. Accordingly, even when the table 44F is moved, the reel holder 60 is substantially prevented from vibrating because of the inertia of the holder 60 itself or the inertia of the EC tape 52 accommodated in the holder 60. Thus, the cartridge 50 is prevented from vibrating, and the component-supply position of the cartridge 50 is accurately positioned right below the component sucking position of the index table 20 or each component sucking head 22. The vibration of the reel holder 60 is very small, if any, as compared with the case where the movement of the holder 60 in the widthwise direction thereof is not prevented. That small vibration of the reel holder 60 does not substantially change the position of the component-supply portion of the cartridge 50 rigidly or firmly attached to the table 44F, relative to the component sucking position of the index table 20.

Thus, a plurality of cartridges 50 are attached to each of the tables 44A–44F, by a plurality of attaching devices, respectively, and are supported by the same such that the respective component-supply portions of the cartridges 50 are arranged along a straight line parallel to the table guides 42. Each cartridge 50 supplies, from the component-supply portion thereof, the ECs carried on the EC tape 52, to the EC mounting apparatus 12.

When each cartridge 50 is detached from the table 44F, first, the cartridge 50 is drawn rearward a little against the biasing force of the coil spring 148, so as to release the engagement of the two inclined surfaces 84, 114. Subsequently, the rear portion of the cartridge 50 is drawn upward, so that the cartridge 50 is rotated about the front end thereof and the rear portion thereof is moved away from the support surfaces 105. Because of the provision of the guide surface 90, the second positioning projection 88 is released from the engagement with the engaging lever 134 with a considerably small amount of rearward movement of the roller 152. Thus, the cartridge 50 is detached from the table 44F. In addition, as the cartridge 50 is rotated as described above, the engaging portion 184 of the reel receiver 158 is released from the fitting groove 222, the recess 220 formed in the bottom wall of the receiver 158 is released from the wall 216, and the pair of side walls of the receiver 158 are released from the fitting grooves 214. Thus, the reel holder 60 is released from the engagement with the reel-holder-vibration preventing device 200.

The bed 34 has, in the X direction, a predetermined length equal to a total length which would be had by twelve tables 44 connected in series in the X direction, and the middle position of the predetermined length in the X direction corresponds to the component sucking position of the index table 20. One of the twelve component sucking heads 22 mounted on the index table 20 that is being indexed at the component sucking position, picks up by suction an EC from the cartridge 50 being positioned at the middle position of the predetermined length, i.e., under the component sucking position.

Figure 16:
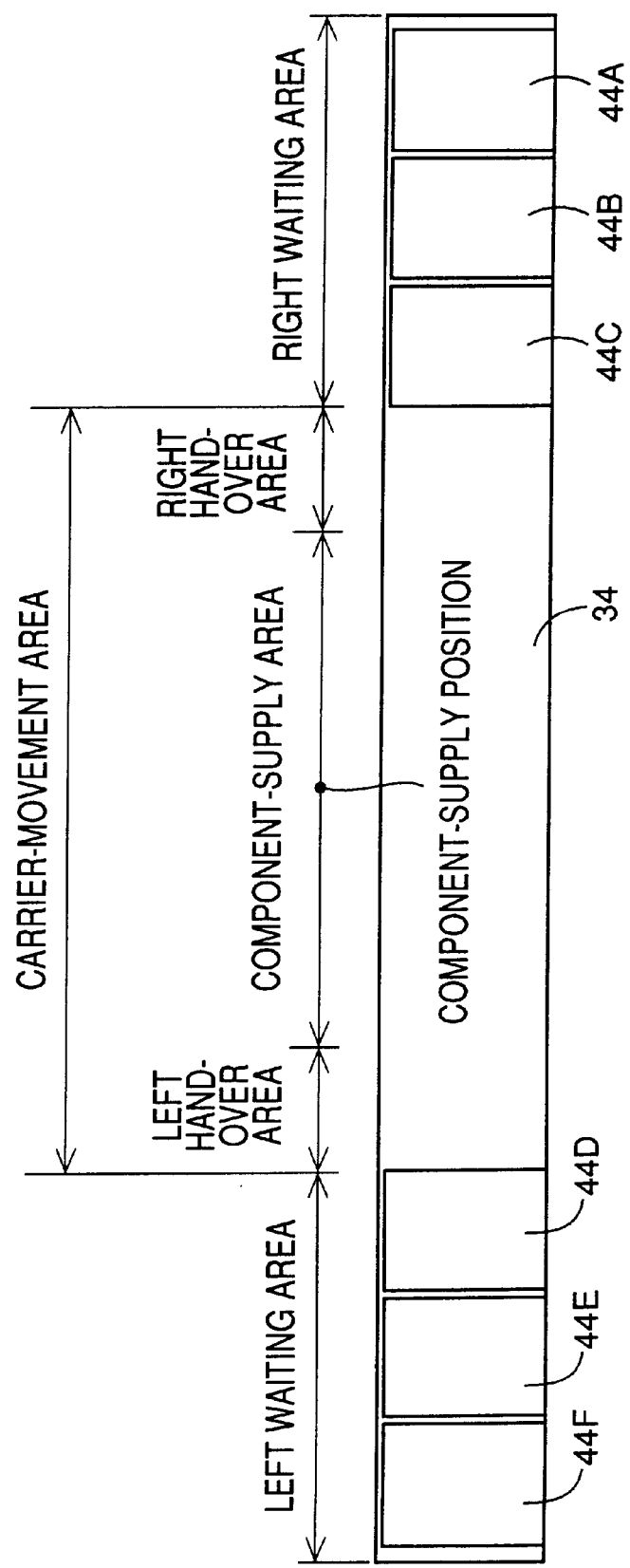
FIG. 16 is a view illustrating a carrier-movement area and a left and a right waiting area which are provided on the EC supplying apparatus of FIG. 1.

As illustrated in FIG. 16, the bed 34 has a carrier-movement area having, in the X direction, a predetermined length equal to a total length which would be had by six tables 44 connected in series in the X direction, i.e, half the predetermined length on one side of the middle position and the other half length on the other side of the middle position. The carrier-movement area includes a component-supply area having a location and a length corresponding to the intermediate four tables 44 of the above-indicated six tables 44, i.e., half the component-supply area corresponding to the intermediate two tables 44 on one side of the middle position and the other half area corresponding to the intermediate two tables 44 on the other side of the same. The carrier-movement area includes, in addition to the component-supply area, a left and a right hand-over area on both sides of the component-supply area, respectively. The left hand-over area has a location and a length corresponding to the end table 44 on one side of the middle position, and the right hand-over area has a location and a length corresponding to the end table 44 on the other side of the middle position. The bed 34 has, in addition to the carrier-movement area, a left and a right waiting area on both sides of the the carrier-movement area, respectively. Each of the two waiting areas has a length corresponding to three tables 44.

On the bed, there are provided three carriers 300A, 300B, 300C (FIG. 15) and a right and a left table retracting device 302, 304 (FIG. 13). In the present EC supplying apparatus 10, the six tables 44A–44F are divided into two groups, i.e., a group of three right-hand tables 44A, 44B, 44C (hereinafter, referred to as the "right table group") and a group of three left-hand tables 44D, 44E, 44F (hereinafter, referred to as the "left table group"). Each of the tables 44A, 44B, 44C of the right table group is retracted to the right waiting area by the right table retracting device 302, and each of the tables 44D, 44E, 44F of the left table group is retracted to the left waiting area by the left table retracting device 304.

Next, there will be described the right table retracting device 302.

As shown in FIG. 15, the table retracting device 302 includes a rail-like, right movable-member guide 310 which extends over the respective entire lengths of the right waiting area and the carrier-movement area. The movable-member guide 310 is provided in rear of the rear table guide 42 away from the EC mounting apparatus 12. A right movable member 312 is supported by the movable-member guide rail 310 such that the movable member 312 is movable relative to the guide rail 310. The movable member 312 is provided by a plate-like member having a length slightly shorter than the total length of three tables 44. Four guide blocks 314 which are fixed to the lower surface of the movable member 312 fit on the guide rail 310, so that the movable member 312 is movable by being guided by the guide rail 310.

Figure 17:
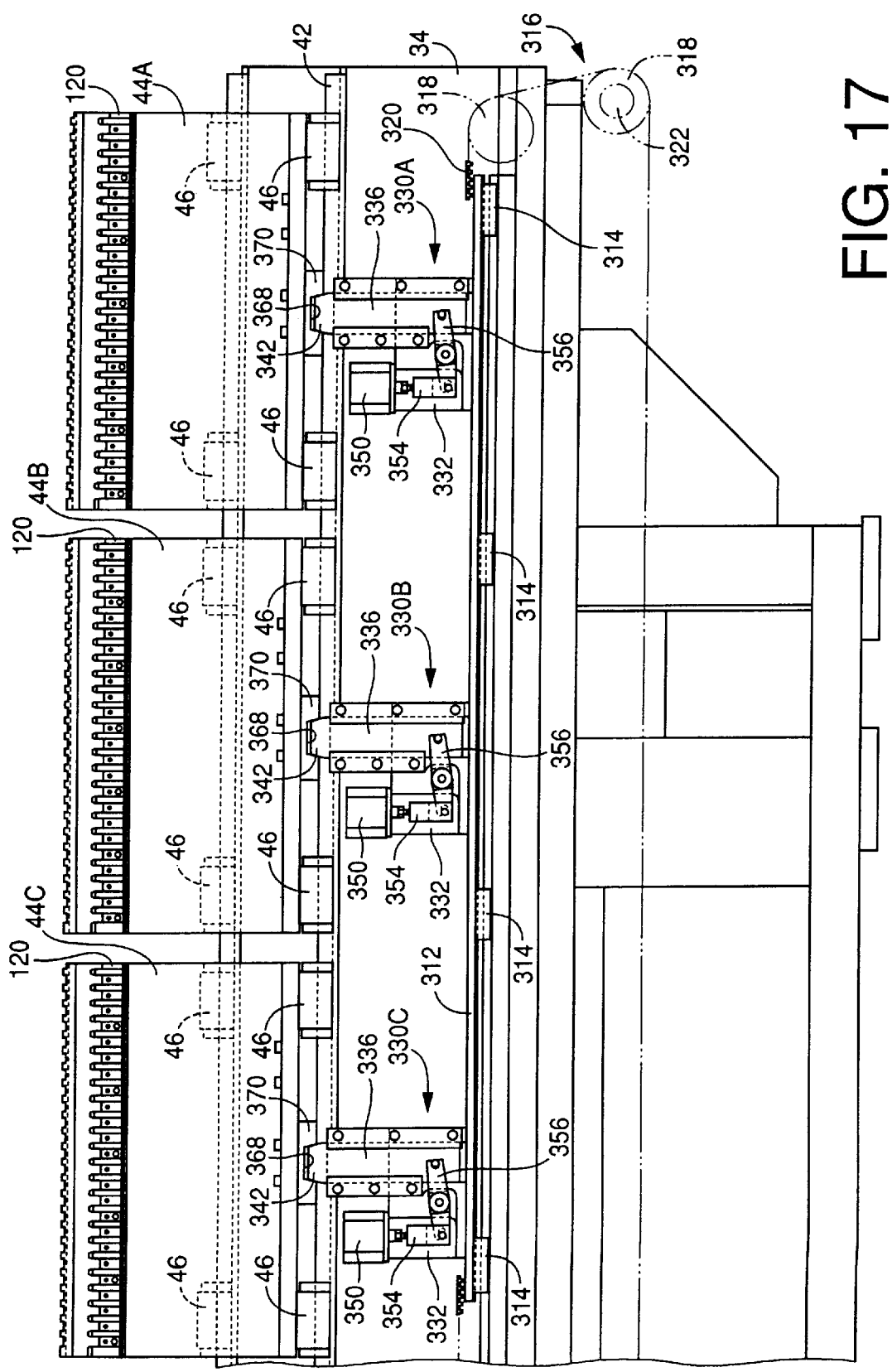
FIG. 17 is a front elevation view of a right table retracting device of the EC supplying apparatus of FIG. 1.

The movable member 312 is moved by a right movable-member moving device 316 shown in FIG. 17. The moving device 316 includes four timing pulleys 318 as rotatable members which are provided on the bed such that the pulleys 318 are rotatable about respective horizontal axis lines perpendicular to the table guides 42. The two pulleys 318 are provided at one end of the carrier-movement ("CM") area on the side of the left waiting ("LW") area, and the other two pulleys 318 are provided at one end of the right waiting ("RW") area away from the CM area. An endless timing or cog belt 320 as a wound-on member is wound on the four pulleys 318. The timing belt 320 extends parallel to the table guides 42, and the movable member 312 is connected via a connecting device or member (not shown) to the upper horizontal half portion of the belt 320 that is supported by the upper two pulleys 318.

One of the two pulleys 318 provided at the one end of the RW area is rotated by a right retracting servomotor 322. Therefore, when the servomotor 322 is started, the pulleys 318 are rotated and the belt 320 is moved, so that the movable member 312 is moved within the CM area and the RW area. The amount of rotation of the servomotor 322 is detected or measured by an encoder 324 (FIG. 20), and the movable member 312 can be stopped at any desired position within the CM and RW areas based on the output of the encoder 324 under control of a control device 470 (FIG. 20) which will be described later.

As shown in FIG. 17, three retraction-related engaging devices 330A, 330B, 330C are provided on the movable member 312, at regular intervals longer than the length of the tables 44 in the X direction. Since the three engaging devices 330A–330C have the same construction, the engaging device 330A will be described as a representative of all the devices 330A–330C. In FIG. 17, the cartridges 50, the engaging levers 34 provided on the tables 44A–44C, the reel-holder-vibration preventing devices 200, etc. are omitted for easier understanding purposes only.

Figure 18:
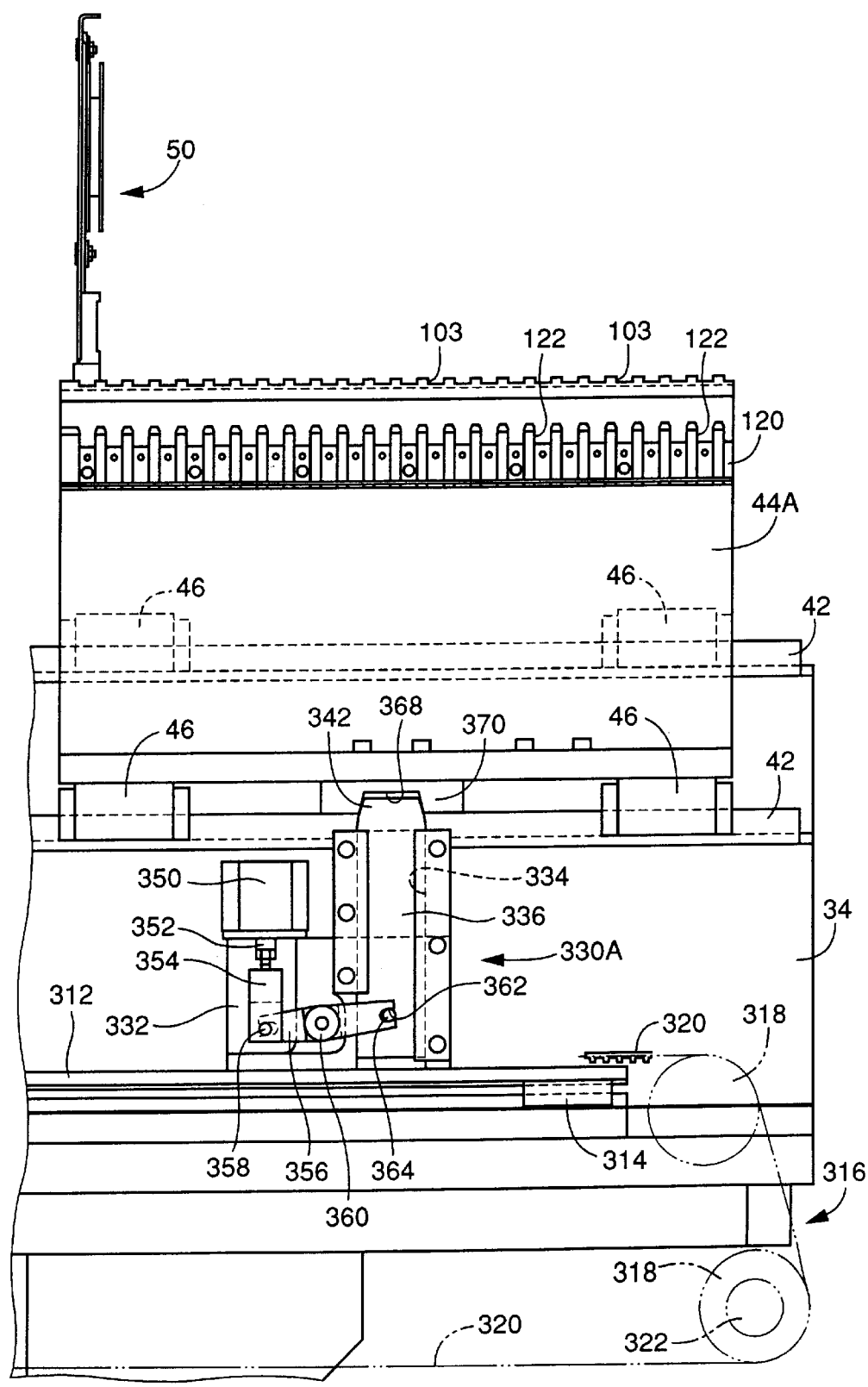
FIG. 18 is a side elevation view of the right table retracting device of FIG. 17.

The engaging device 330A includes a main member 332 fixed to the movable member 312. As shown in FIG. 18, the main member 332 has a vertical fitting groove 334, and an engaging member 336 is slideably fit in the fitting groove 334. An upper end portion of the engaging member 336 provides an engaging portion 342 whose width (i.e., dimension in the direction of movement of the movable member 312) decreases in the upward direction. In FIG. 18, the reel holders 60, second positioning projections 88, etc. of the cartridges 50 and the engaging levers 34, reel-holder-vibration preventing devices 200, etc. of the table 44A are omitted for easier understanding purposes only.

An engagement-disengagement air cylinder 350 is provided, on the main member 312, adjacent to the engaging member 336 in the direction of movement of the movable member 312. A piston rod 352 of the air cylinder 350 is oriented downward, and a pin 358 is fixed to a yoke-like connecting member 354 fixed to the tip of the piston rod 352. The pin 358 is engaged with a recess formed in one end portion of a lever 356 such that the lever 356 is rotatable about a horizontal axis member 360 perpendicular to the table guides 42. The axis member 360 projects from the main member 332 in a direction perpendicular to the direction of arrangement of the engaging member 336 and the air cylinder 350, and supports the middle portion of the lever 356 in the lengthwise direction thereof. The lever 356 has a recess 362 in the other end portion thereof, and a pin 364 which projects from the engaging member 336 is engaged with the recess 362. Therefore, as the piston rod 336 is extended, the lever 356 is rotated and the engaging member 336 is moved upward and, as the piston rod 336 is retracted, the lever 356 is rotated and the engaging member 336 is moved downward. Thus, the engaging member 336 is moved between an engaged position in which the engaging member 336 is engaged with an engaging groove 368 formed in the table 44A, and in a disengaged position in which the engaging member 336 is not engaged with the engaging groove 368, i.e., is disengaged from the engaging groove 368.

The engaging groove 368 is formed in an engaging body 370 fixed to the lower surface of the table 44A. As shown in FIG. 2, the engaging groove 368 is formed through the entire length of the engaging body 370 in the Y direction, and has a predetermined length which enables two engaging members 336 to engage simultaneously the groove 368. As shown in FIG. 18, the engaging groove 368 has a trapezoidal cross section corresponding to that of the engaging portion 342 of the engaging member 336, thereby guiding the fitting of the engaging portion 342 in the engaging groove 368. The engaging body 370 and the engaging portion 342 of the engaging member 336 are formed of a wear-resistant material.

The timings at which the piston 352 of the air cylinder 350 has been extended by its maximum amount (i.e., its stroke) and has been retracted to its original position are identified as the timings at which a sensor (not shown) fixed to the main member 332 detects two detectable members (not shown) fixed to the engaging member 336. Thus, the timings at which the engaging member 336 is moved to its engaged and disengaged positions are known.

As shown in FIG. 15, the left table retracting device 304 includes a left movable-member guide 378 which is provided in front of the right movable-member guide 310, i.e., between the guide 310 and the rear table guide 42. The left guide 378 extends over the respective entire lengths of the CM area and the left waiting ("LW") area. Similar to the right table retracting device 302, the left table retracting device 304 includes a left movable member 382, a left movable-member moving device 384 (FIG. 13), and three retraction-related engaging devices 330D, 330E, 330F. The left movable member 382 is supported on the left guide 378 via four guide blocks 380 such that the movable member 382 is movable relative to the left guide 378. As shown in FIG. 13, the left movable-member moving device 384 includes four timing pulleys 388. Two of the four pulleys 388 are provided at the other end of the CM area on the side of the RW area, and the other two pulleys 318 are provided at one end of the LW area away from the CM area. An endless timing or cog belt 392 is wound on the four pulleys 388. The timing belt 392 extends parallel to the table guides 42, and the movable member 382 is connected to the upper horizontal half portion of the belt 392 that is supported by the upper two pulleys 388. One of the two pulleys 318 provided at the one end of the LW area is rotated by a left retracting servomotor 390. Therefore, when the servomotor 390 is started, the pulleys 388 are rotated and the belt 392 is moved, so that the movable member 382 is moved within the CM area and the LW area. The amount of rotation of the servomotor 390 is detected or measured by an encoder 394 (FIG. 20), and the movable member 382 can be stopped at any desired position within the CM and LW areas based on the output of the encoder 394 under control of the control device 470 (FIG. 20) which will be described later.

The retraction-related engaging devices 330D, 330E, 330F have the same construction as that of the retraction-related engaging devices 330A, 330B, 330C. Each of the six engaging devices 330A–330F engages only a corresponding one of the six tables 44A–44F, i.e., engages only the table having the same alphabet ("A" to "F"). However, as shown in FIG. 2, the engaging member 336 of each of the engaging devices 330A–330C engages a rear portion of the engaging groove 368 of the engaging body 370 of the corresponding table 44A–44C in the Y direction, and the engaging member 336 of each of the engaging devices 330D–330F engages a front portion of the engaging groove 368 of the engaging body 370 of the corresponding table 44D–44F in the Y direction, because the right and left table retracting devices 302, 304 are provided at different positions in the Y direction such that they do not interfere with each other. FIG. 2 shows for easier understanding purposes only that the respective engaging members 336 of the two engaging devices 330A, 330F engage the single engaging groove 368 of the table 44F. In fact, it is only the engaging member 336 of the engaging device 330F that engages the engaging groove 368 of the table 44F.

As shown in FIG. 15, there are provided three feeding screws 400 on the bed 34 such that the feeding screws 400 extend parallel to one another and parallel to the table guides 42. Each of the feeding screws 400 is supported by brackets 396, 398 such that the screw 400 is rotatable about an axis line thereof and is not movable along the axis line. Each of the carriers 300A–300C has a nut 402 (FIG. 2) which is fixed thereto and which is threadedly engaged with a corresponding one of the feeding screws 400. In addition, there are provided three rail-like carrier guides 404 on the bed 34 such that the carrier guides 404 extend parallel to the feeding screws 400. Each of the carriers 300A–300F is fit on a corresponding one of the carrier guides 404 via a guide block 406 (FIG. 2) fixed to the lower surface of the carrier, such that the carrier is slideable on the carrier guide 404. The feeding screws 400 and the carrier guides 404 extend over the entire length of the CM area in the X direction.

A timing pulley 410 is fixed to one end of each of the three feeding screws 400 and, as shown in FIG. 2, is connected via a timing belt 416 to a timing pulley 414 fixed to the output shaft of a corresponding one of three carrier servomotors 412 attached to the bed 34. The bed 34 has three recesses (not shown) for accommodating the three servomotors 412, respectively. When each of the servomotors 412 is started, a corresponding one of the feeding screws 400 is rotated, so that a corresponding one of the carriers 300A–300C is moved along the table guides 42. The timing pulleys 410, 414 and the timing belt 416 cooperate with one another to provide a rotation transmitting device, which cooperates with the carrier servomotor 412 as a drive source to provide a screw driving device. The amount of rotation of each of the servomotors 412 is detected by a corresponding one of three encoders 418 (FIG. 20), and each of the carriers 300A–300C can be stopped at any desired position within the CM area. In FIG. 2, the bracket 396, etc. for the carrier 300B and the bracket 398, the timing pulley 410, etc. for the carrier 300A are omitted and are not shown.

As shown in FIG. 15, the three feeding screws 400 are provided at regular intervals in the Y direction. On the other hand, the carrier servomotor 412 for the middle feeding screw 400 is provided at one end of the CM area in the X direction, and the two carrier servomotors 412 for the two end feeding screws 400 are provided at the other end of the CM area, so that the dimension of a space occupied by the three servomotors 412 in the Y direction is reduced.

Figure 19:
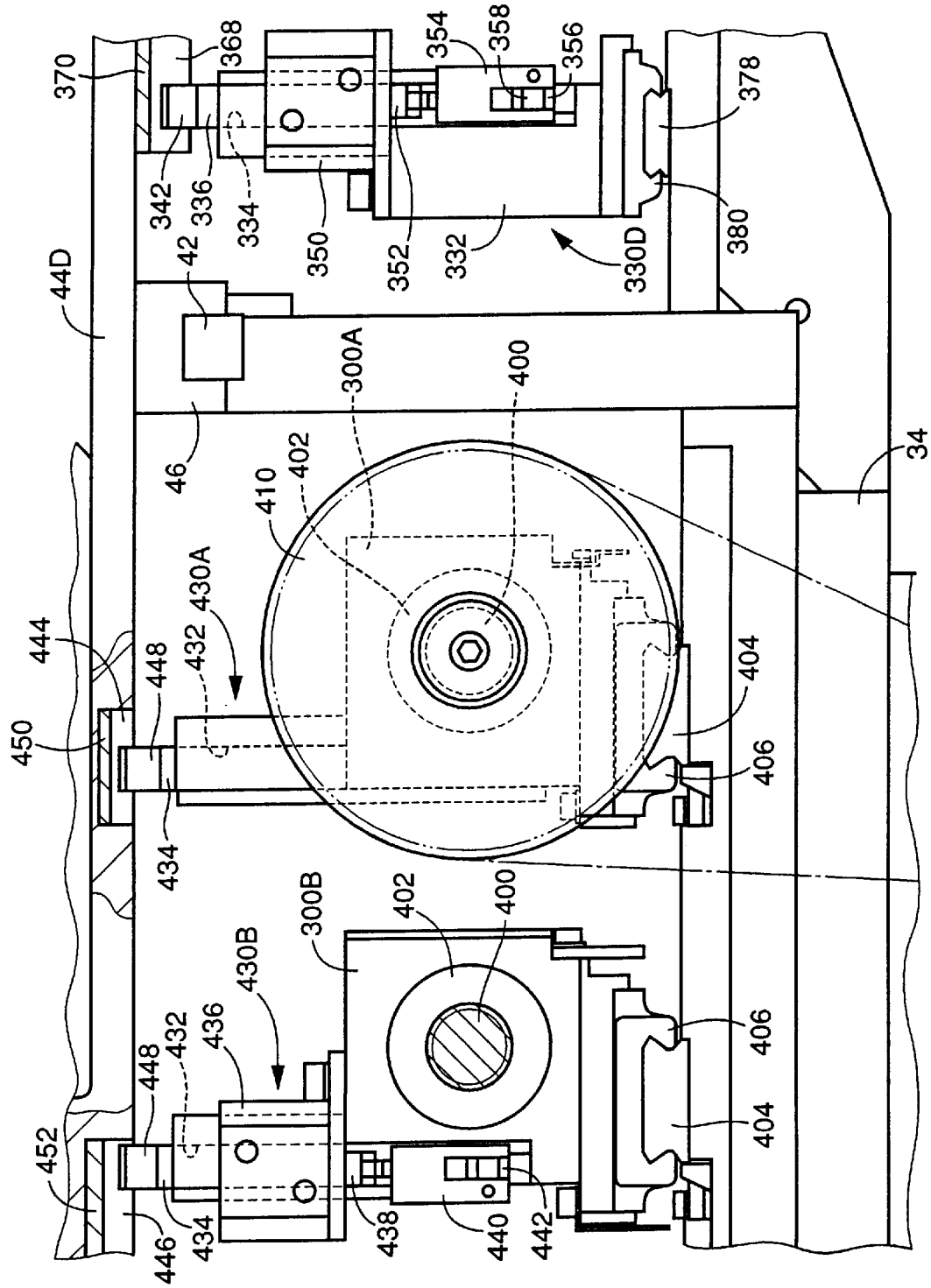
FIG. 19 is an elevation view of the carrier of the EC supplying apparatus of FIG. 1.

As shown in FIG. 2, the three carriers 300A–300C have respective carrier-related engaging devices 430A, 430B, 430C. The carrier-related engaging devices 430A–430C have the same construction as that of the retraction-related engaging devices 330A–330F. As shown in FIG. 19, each of the engaging devices 430A–430C includes an engaging member 434 which is fit in a vertical fitting groove 432 such that the engaging member 434 is movable relative to the fitting groove 432, and an air cylinder 436 having a piston rod 438 to which a connecting member 440 is fixed. The connecting member 440 and the engaging member 434 are connected to each other via a lever 442, like the engaging device 330A–330F. When the piston rod 438 is extended and retracted, the engaging member 434 is moved between its engaged position in which the engaging member 434 is engaged with an engaging groove 444 or 446 formed in the corresponding table 44A–44F and its disengaged position in which the engaging member 434 is disengaged from the engaging groove 444, 446. The engaging member 434 includes, at the tip end portion thereof, an engaging portion 448 which has a trapezoidal shape, like the engaging portion 342 of the engaging member 336 of the engaging device 330A–330F, and guides the fitting of the engaging member 434 in the engaging groove 444, 446. In FIG. 19, the bracket 396, etc. for the carrier 300B and the bracket 398, etc. for the carrier 300A are omitted.

As shown in FIGS. 2 and 19, each of the tables 44A–44F has an engaging body 450 which is fixed to a middle position of the lower surface thereof in the direction parallel to the table guides 42, at a position corresponding to the engaging member 434 of the engaging device 430A of the carrier 300A in the Y direction, and additionally has an engaging body 452 which is fixed to the middle position of the lower surface thereof in the direction parallel to the table guides 42, at a position corresponding to the engaging members 434 of the engaging devices 430A, 430B of the carriers 300A, 300B in the Y direction. The engaging bodies 450, 452 have the engaging grooves 444, 446, respectively, which extend therethrough in the Y direction and which have the trapezoidal cross section. The engaging groove 446 has, in the Y direction, a length which assures that the respective engaging members 434 of the two engaging devices 430A, 430B can simultaneously engage the groove 446. However, each of the tables 44A–44F can be engaged with a selected one of the respective engaging members 434 of the three carriers 300A–300C, i.e., cannot simultaneously be engaged with two or more of the respective engaging members 434 of the three carriers 300A–300C. When one of the carriers 300A–300C is moved with its engaging member 434 being engaged with one of the tables 44A–44F, the one table is moved by being guided by the table guides 42. The engaging bodies 450, 452 and the respective engaging portions 488 of the engaging members 434 of the engaging devices 430A–430C are formed of a wear-resistant material.

Figure 23:
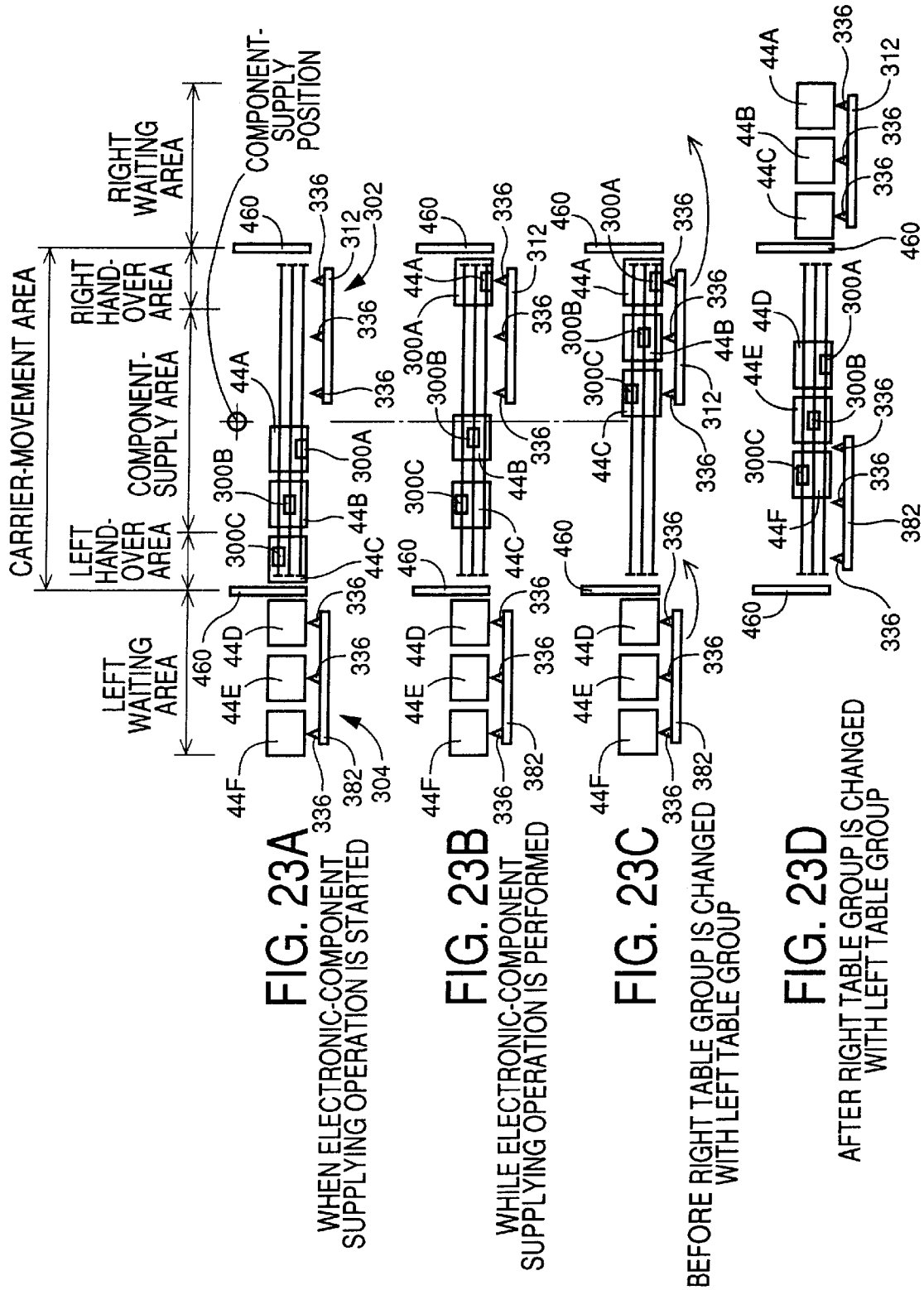
FIG. 23(A) is a view illustrating the first step of a second EC supplying mode which can be selected on the EC supplying apparatus of FIG. 1.
FIG. 23(B) is a view illustrating the second step of the second EC supplying mode.
FIG. 23(C) is a view illustrating the third step of the second EC supplying mode.
FIG. 23(D) is a view illustrating the last step of the second EC supplying mode.

As illustratively shown in FIG. 23, a shutter 460 is provided between the RW area and the right hand-over ("RHO") area and a shutter 460 is provided between the LW area and the left hand-over ("LHO") area. Each of the two shutters 460 is moved upward and downward by an elevating and lowering device (not shown). When each shutter 460 is moved downward to, and held at, its lower dead position (i.e., "closed" position), the lower end of each shutter 460 is adjacent to respective upper surfaces of the two table guides 42. Thus, an operator who is operating within the RW or LW area is prevented from contacting the tables 44 or cartridges 50 which are moving within the CM area. When each shutter 460 is moved upward to, and held at, its upper dead position (i.e., "open" position), the lower end of each shutter 460 is positioned above the cartridges 50 of the tables 44 supported on the table guides 42, so that the tables 44A–44F are permitted to move between the RW or LW area and the CM area.

The EC supplying apparatus 10 is controlled by the control device 470 shown in FIG. 20. The control device 470 is essentially provided by a computer 480 including a central processing unit (CPU) 472, a read only memory (ROM) 474, a random access memory (RAM) 476, and a bus 478 connecting the CPU 472, the ROM 474, and the RAM 476 with one another. An input interface 482 is connected to the bus 478, and the encoders 324, 394, 418 are connected to the input interface 482. In addition, abnormal-table-proximity sensors 484 are connected to the input interface 482.

Each of the proximity sensors 484 is provided by a photoelectric switch of a transmission type including a light emitter and a light detector. As shown in FIG. 12, each of the tables 44A–44F has one proximity sensor 484 attached to one of opposite ends of the outer surface of the rear wall 218 of the bucket 202, fixed to the each table, in the direction of moving of the each table, and a plate-like light-shading member 500 as a detectable member which is fixed to the other end of the rear wall 218. The light emitter and the light detector of the proximity sensor 384 are provided away from each other in a horizontal direction normal to the direction of moving of the each table. A clearance is provided between the light emitter and the light detector such that the light-shading member 500, which is fixed to the other end of the rear wall 218 of the bucket 202 fixed to the table adjacent to the each table, passes through the clearance in the direction of moving of the adjacent table. The light-shading member 500 provided on each of the tables 44A–44E and the abnormal-table-proximity sensor 484 provided on a corresponding one of the tables 44B–44F cooperate with each other to provide an abnormal-table-proximity detecting device. The table 44F may not have the abnormal-table-proximity sensor 484 and the table 44A may not have the light-shading member 500.

The light-shading member 500 projects from one side surface of the bucket 202 of each table 44 toward the adjacent table 44 in the direction of moving of the each table 44. When the shading member 500 of one table 44 enters the clearance between the light emitter and the light detector of the abnormal-table-proximity sensor 384 of the adjacent table 44 and shades the light detector by reflecting the light emitted by the light emitter, the control device 470 identifies, based on an abnormal-proximity signal supplied from the sensor 384, that the one table 44 is in abnormal proximity to the adjacent table 44, and stops all the carriers 300 which are being moving, thereby preventing the tables 44 from colliding with each other. A portion of the control device 470 for stopping the carriers 300 based on the abnormal-proximity signal supplied from each of the sensors 384 provides a table stopping means.

The length of projection of the light-shading member 500 from the bucket 202 is equal to the sum of (a) a distance needed to stop the tables 44 after the shading member 500 of one table 44 starts entering the clearance between the light emitter and detector of the sensor 484 of the adjacent table 44 and the control device 470 commands the carrier servomotors 412 to stop the carriers 300, (b) a distance to be left between the one table 44 and the adjacent table 44 after the tables 44 have been stopped, and (c) a distance from one of opposite side surfaces of the bucket 202 of the adjacent table 44 that is nearer to the sensor 484, to the center of the sensor 484 of the adjacent table 44. The sum of the two distances (a), (b) will be referred to as the abnormal-proximity detection distance. The shading member 500 is permitted to move in the clearance between the light emitter and detector of the sensor 484 until the tables 44 are stopped under control of the control device 470.

Meanwhile, an abnormality may occur when each of opposite end tables 44 out of a plurality of tables 44 which are being moved within the CM area is being moved from the component-supplying ("CS") area to the RHO or LHO area, that is, each carrier 300 may go beyond the predetermined RHO or LHO area, toward the bracket 396 or 398 which supports the corresponding feeding screw 400. This abnormality is detected and the collision of the each carrier 300 with the bracket 396, 398 is prevented. The position of each carrier 300 within the CM area is known from the amount of rotation of the corresponding servomotor 412 that is detected by the corresponding encoder 418. If each carrier 300 goes beyond the RHO or LHO area and makes abnormal proximity to the bracket 396, 398, the control device 470 detects the abnormal proximity based on the output signal supplied from the corresponding encoder 418, and stops all the carriers 300 based on the detected abnormal proximity. The encoders 418 and a portion of the control device 470 for detecting the abnormal proximity of each carrier 300 based on the output signal supplied from the corresponding encoder 418 cooperate with each other to provide a carrier-abnormality detecting means, and a portion of the control device 470 for stopping the carriers 300 provides a carrier stopping means.

The retraction-related engaging devices 300A–300C of the right table retracting devices 302 are so designed as to engage the tables 44A–44C to the right movable member 312, respectively, such that the tables 44A–44C engage with the movable member 312 are distant from each other by more than the above-indicated abnormal-proximity detection distance. This is also the case with the left table retracting devices 304. Thus, the control device 470 does not receive any abnormal-proximity signal from the sensors 384, when the tables 44A–44C are engaged with the movable member 312 and when the tables 44D–44F are engaged with the movable member 382.

An output interface 486 is connected to the bus 478. The output interface 486 is connected to the index servomotor 26, the right retracting servomotor 322, the left retracting servomotor 390, the retraction-related air cylinders 350, the carrier servomotors 412, and the carrier-related air cylinders 436 via drive circuits 488, 490, 492, 494, 496, 498, respectively. Although the control 470 additionally controls the EC mounting apparatus 12 and the PCB positioning apparatus 14, the manner of control of the two apparatuses 12, 14 is not shown in the drawings, except for the index servomotor 26.

Next, there will be described the operation of the EC supplying apparatus 12 constructed as described above.

The present EC supplying apparatus 10 can be operated in three EC supplying modes. In the first mode, all the six tables 44A–44F are used as a single group for supplying ECs to a single PCB 16. More specifically described, each of the six tables 44A–44F is moved, as a general rule, in only one direction to supply ECs.

In the second mode, only one of the right table group including the tables 44A–44C and the left table group including the tables 44D–44F is selected for supplying ECs to a single PCB 16. More specifically described, a series of predetermined steps are repeated for using the tables of the selected group to supply ECs, and the tables of the other group are controlled to wait within the RW or LW area, permitting the operator to replace the supply reels 56, the take-up reels 76, the cartridges 50, etc. of the tables with different ones.

In the third mode, only one of the right table group and the left table group is selected for supplying ECs to a single PCB 16, and the other group is controlled to wait within the RW or LW area, like in the second mode. However, the third mode is different from the second mode in that in the third mode a single PCB 16 of a first sort and a single PCB of a second sort are alternately used, or a predetermined number of successive PCBs 16 of a first sort and the same number of successive PCBs 16 of a second sort are used and that the right and left table groups are alternately selected to supply ECs to the PCBs of the first and second sorts, respectively. Accordingly, neither the right nor left table group remains waiting so long in the RW or LW area.

First, the first EC supplying mode will be described below.

Figure 21:
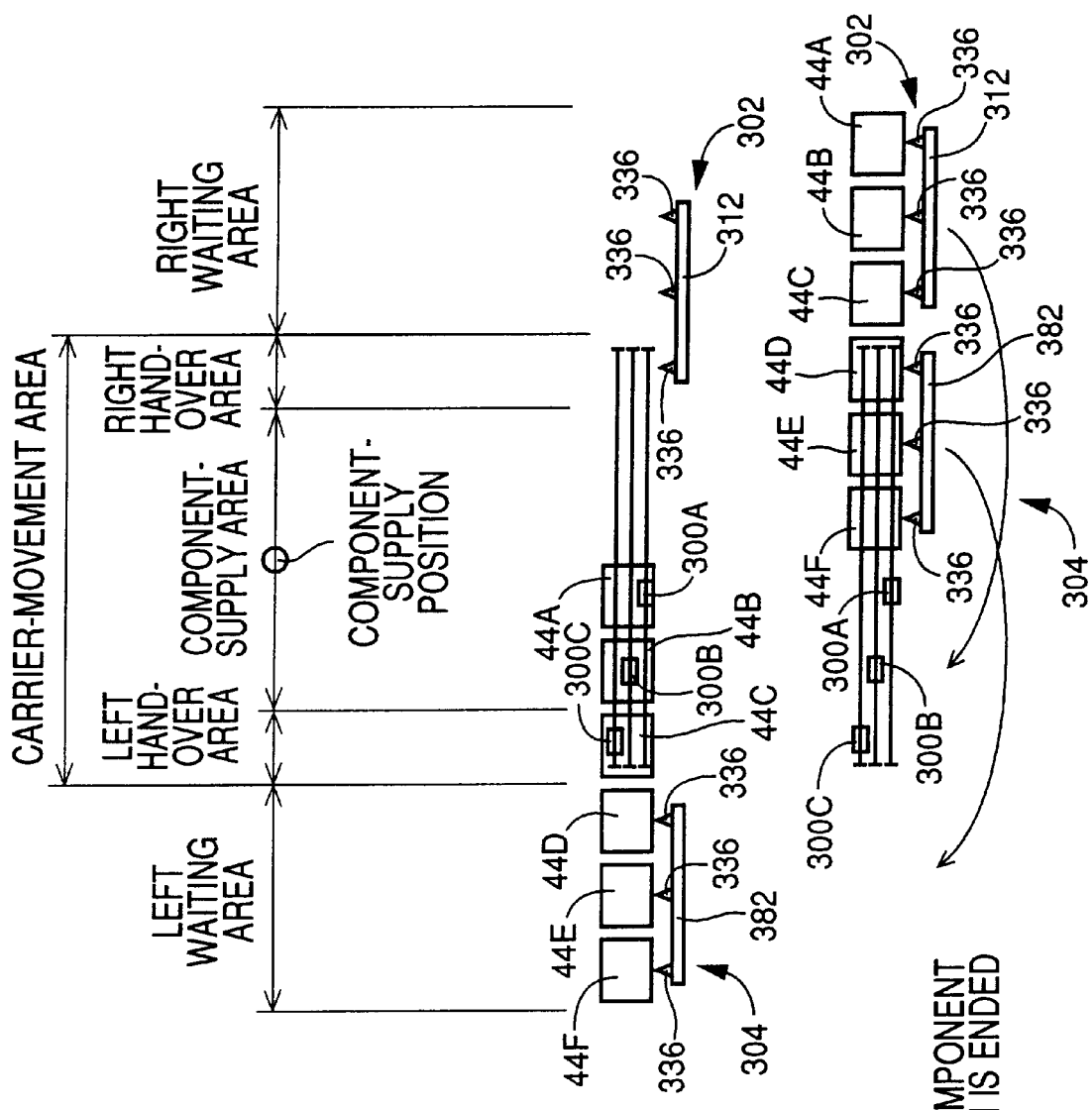
FIG. 21(A) is a view illustrating the first step of a first EC supplying mode which can be selected on the EC supplying apparatus of FIG. 1.
FIG. 21(B) is a view illustrating the last step of the first EC supplying mode.

It is assumed here that the tables 44A–44F are moved in a direction from the LW area to the RW are via the CM area while supplying ECs to the EC mounting apparatus 12. However, the tables 44A–44F may be moved in the opposite direction. As shown in FIG. 21(A), when the EC supplying operation is started, the tables 44D–44F of the left table group are controlled to wait in the LW area and the respective engaging members 336 of the engaging devices 330D–330F of the left table retracting device 304 are engaged with the tables 44D–44F, respectively. In addition, the tables 44A–44C of the right table group are positioned within the LHO area and the CS area and the respective engaging members 434 of the engaging devices 430A–430C of the carriers 300A–399C are engaged with the tables 44A–44C, respectively. First, the table 44A supplies ECs. Simultaneously, two tables 44 are moved within the CS area such that the leading table 44 supplies ECs and the trailing table 44 is moved to follow the leading table 44A so as to prepare for subsequent EC supplying. As shown in FIG. 21(B), when the EC supplying operation is ended, the tables 44A–44C of the right table group are controlled to wait in the RW area and the tables 44D–44F of the left table group are positioned within the RHO area and the CS area. The respective engaging members 336 of the engaging devices 330A–330F of the right and left table retracting devices 302, 304 are engaged with the tables 44A–44F, respectively, and the respective engaging members 434 of the engaging devices 430A–430C of the carriers 300A–300C are disengaged from the tables 44D–44F, respectively. Thus, the tables 44A–44F are returned to their original positions shown in FIG. 21(A). In the first mode, both the two shutters 460 are controlled to be held in their open positions.

Within the CS area, the above-indicated two tables may be moved in synchronism with each other. In this case, however, the sum of respective masses of the two tables is moved and accordingly a great vibration is produced. To avoid this, the trailing table following the leading table which supplies ECs is accelerated or decelerated at a value (i.e., absolute value) smaller than that at which the leading table is accelerated or decelerated. For example, the acceleration or deceleration of the leading table 44 is predetermined such that while each component sucking head 22 is moved by a first pitch, the leading table 44 is moved by a second pitch. The first pitch is defined as an angle obtained by dividing 360 degrees by the number (i.e., twelve) of component sucking heads 22 of the index table 20, and the second pitch is defined as being equal to the predetermined pitch at which the cartridges 50 are attached to each table 44 (i.e., distance between adjacent two cartridges 50 attached to each table). The acceleration or deceleration of the trailing table 44 is predetermined such that during one cycle in which each component sucking head 22 is rotated by the first pitch and moved downward and upward to take an EC from one cartridge 50, the trailing table 44 is moved by the second pitch.

The supplying of ECs is performed by moving each table 44, as a general rule, in one direction from the LW area to the RW area. However, in special cases, for example, in the case where one component sucking head 22 fails to suck one EC from one cartridge 50, one table 44 may be moved back so that the sucking head 22 may suck another EC from the same cartridge 50 at the component sucking position corresponding to the middle position of the CS area.

If the leading table 44 is accelerated at a value greater than that at which the trailing table 44 is accelerated, or if the leading table 44 is decelerated at a value smaller than that at which the trailing table 44 is decelerated, those two tables 44 are prevented from colliding with each other. However, if not, the trailing table 44 may collide with the leading table 44. Therefore, in the special case where the leading table 44 is moved back, the trailing table 44 is accelerated or decelerated at the same value as that at which the leading table 44 is accelerated or decelerated, so that the trailing table 44 is prevented from colliding with the leading table 44. In addition, when the leading table 44 that has just supplied ECs is changed with the trailing table 44 that is next to supply ECs, the trailing table 44 is accelerated or decelerated at the same value as that at which the leading table 44 is accelerated or decelerated, so that the tables 44 may quickly be changed with each other.

The leading and trailing tables 44 are moved with the shortest possible distance being left therebetween. However, the shortest possible distance must be longer than the above-described abnormal-proximity detection distance, that is, must permit the tables 44 to be stopped when an abnormal table proximity is detected by the abnormal-table-proximity detecting device 484, 500. This distance may be equal to the length of projection of the light-shading member 500 from the side surface of the bucket 200. Therefore, the distance between the trailing or last cartridge 50 on the leading table 44 and the leading or first cartridge 50 on the trailing table 44 is longer than the pitch at which the cartridges 50 are attached to each table 44 (hereinafter, referred as the "cartridge pitch"). Thus, changing the leading table 44 with the trailing table 44 needs more time than moving each table 44 by a distance equal to the cartridge pitch. Unless the speed of rotation of the index table 20 would be changed, the trailing table 44 could not be in time for supplying an EC to the component sucking head 22. To solve this problem, the rotation speed of the index servomotor 26 is lowered to lower the rotation speed of the index table 20, so that the index table 20 is rotated by one pitch while the leading table 44 is changed with the trailing table 44.

Figure 22:
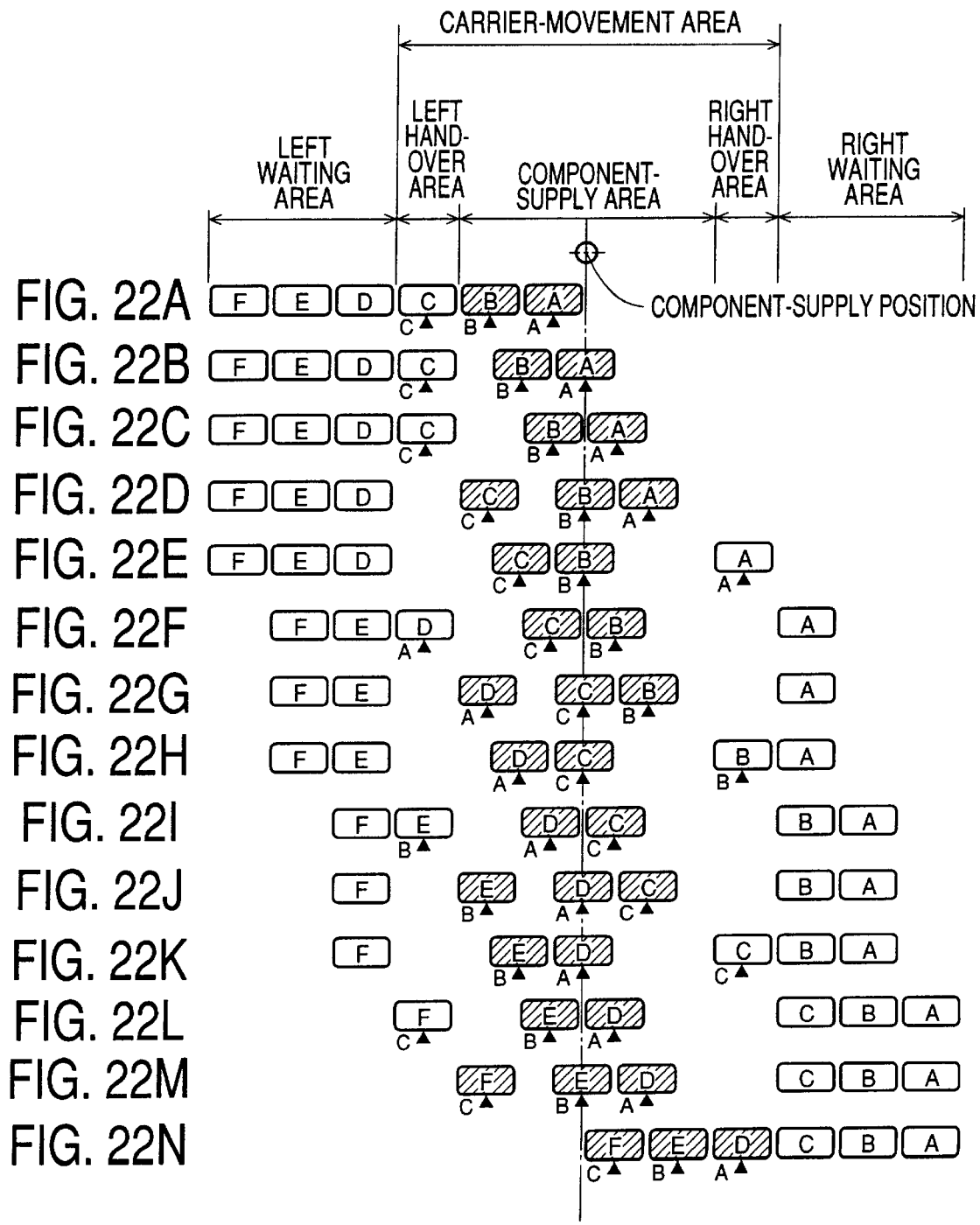
FIG. 22(A) is a view illustrating the first step of the first EC supplying mode.
FIG. 22(B) is a view illustrating the second step of the first EC supplying mode.
FIG. 22(C) is a view illustrating the third step of the first EC supplying mode.
FIG. 22(D) is a view illustrating the fourth step of the first EC supplying mode.
FIG. 22(E) is a view illustrating the fifth step of the first EC supplying mode.
FIG. 22(F) is a view illustrating the sixth step of the first EC supplying mode.
FIG. 22(G) is a view illustrating the seventh step of the first EC supplying mode.
FIG. 22(H) is a view illustrating the eighth step of the first EC supplying mode.
FIG. 22(I) is a view illustrating the ninth step of the first EC supplying mode.
FIG. 22(J) is a view illustrating the tenth step of the first EC supplying mode.
FIG. 22(K) is a view illustrating the eleventh step of the first EC supplying mode.
FIG. 22(L) is a view illustrating the twelfth step of the first EC supplying mode.
FIG. 22(M) is a view illustrating the thirteenth step of the first EC supplying mode.
FIG. 22(N) is a view illustrating the last step of the first EC supplying mode.

Next, there will be described the first EC supplying mode in detail by reference to FIG. 22. In the figure, the tables 44A to 44F are represented by their alphabet letters and rectangles, and the carriers 300A to 300C are represented by their alphabet letters and triangles. The left and right table retracting devices 304, 302 are omitted.

When the EC supplying operation is started, the tables 44A–44F are positioned as shown in FIG. 22(A). First, as shown in FIG. 22(B), the tables 44A, 44B are moved by the carriers 300A, 300B, respectively, so that the table 44A supplies ECs. While the table 44A moves for supplying ECs, the table 44B follows the table 44A, at acceleration or deceleration values smaller than those of the table 44A. However, when the table 44B replaces the table 44A, for next supplying ECs, the table 44B is moved in synchronism with the table 44A, as shown in FIG. 22(C), so that the table 44A is quickly changed with the table 44B.

During the steps shown in FIGS. 22(B) and (C), the table 44C remains engaged with the carrier 300C within the LHO (left hand-over) area. However, after the EC supplying by the table 44A ends and the EC supplying by the table 44B starts, the table 44C is moved from the LHO area to a one-table portion of the CS area that is adjacent to the LHO area so as to wait there, as shown in FIG. 22(D). However, as described above, there are some cases where each table 44 is moved back for supplying an EC. Therefore, there is some possibility that the table 44A is moved back for supplying an EC. When the table 44A is moved back while the table 44C waits in the CS area, the table 44C is also moved back so that the table 44C is prevented from colliding with the table 44B.

After the EC supplying by the table 44A completely ends, the table 44A is moved to the RHO (right hand-over) area and the table 44C is moved by the carrier 300C to follow the table 44B. When the table 44C is catching up with the table 44B, the table 44 B is moved by the carrier 44B for supplying ECs.

When the EC supplying operation is started, the right movable member 312 of the right table retracting device 302 is moved to, and waits, at the position where the movable member 312 extends over the RHO area and a two-table portion of the CS area that is adjacent to the RHO area. After the table 44A is moved to the RHO area, the engaging member 336 of the engaging device 330A is engaged with the table 44A. Subsequently, the carrier 300A is disengaged from the table 44A, and the table 44A is moved to the RW area, as shown in FIG. 22(F).

After the table 44C has caught up with the table 44B to follow the table 44B, the left movable member 382 of the left table retracting device 304 is moved to the CM area to move the table 44D to the LHO area, as shown in FIG. 22(F). The carrier 300A that has been disengaged from the table 44A is moved to the LHO area to engage the table 44D, and the engaging device 330D is disengaged from the table 44D.

After the EC supplying by the table 44B ends and the EC supplying by the table 44C starts, the table 44D is moved by the carrier 300A from the LHO area to the one-table portion of the CS area that is adjacent to the LHO area so as to wait there, as shown in FIG. 22(G). After the EC supplying by the table 44B completely ends, the table 44B is moved by the carrier 300B to the RHO area where the table 44 B is engaged with the engaging device 330B of the right table retracting device 302 and subsequently is disengaged from the carrier 300B. Thereafter, the right movable member 312 is moved by the distance equal to one table 44 toward the RW area, as shown in FIG. 22(I), so that the table 44B is moved to the RW area.

The table 44D is moved while following the table 44C, and the left movable member 382 is moved by the distance equal to one table 44 toward the CS area, so that the table 44E is moved to the LHO area. The carrier 300B is engaged with the table 44E waiting in the LHO area. After the EC supplying of the table 44D has progressed to some extent, the table 44E is moved to the CS area. After the EC supplying of the table 44C has completely ended, the table 44E is moved to follow the table 44D, as shown in FIGS. 22(J) and (K).

The table 44C that has completed the EC supplying is moved to the RHO area where the table 44C is engaged with the engaging device 330C of the right table retracting device 302, and then is disengaged from the carrier 300C. The right movable member 312 is moved by the one-table distance to the rightward direction, so that all the tables 44A, 44B, 44C of the right table group wait within the RW area, as shown in FIG. 22(L). Meanwhile, when the table 44E starts the EC supply, the left movable member 382 is moved by the one-table distance toward the CS area, so that the table 44F is moved to the LHO area, as shown in FIG. 22(L). When the EC supplying of the table 44E has progressed to such an extent that even if the table 44E is moved back by a distance corresponding to one or more cartridges 50, the table 44E does not collide with the table 44F, the table 44F is moved by the carrier 300C to the CS area, as shown in FIG. 22(M). Subsequently, the table 44F supplies ECs.

After all the tables 44A–44F have completed their EC supplying, the tables 44A–44C wait in the RW area and the tables 44D–44F wait in the RHO area and the CS area, as shown in FIG. 22(N). Then, the left movable member 382 is moved to its right end position where the movable member 382 extends over the RHO area and the CS area, so that the engaging devices 330D–330F engage the tables 44D–44F, respectively. Then, the carriers 300A–330C are disengaged from the tables 44D–44F, respectively, and the right and left movable members 312, 382 are moved in the leftward direction, so that the tables 44A–44F are moved back to their initial position shown in FIG. 22(A). Thus, the tables 44A–44F are ready for supplying ECs to the next PCB 16.

Next, there will be described the second EC supplying mode by reference to FIG. 23.

It is assumed that the tables 44A–44C support the cartridges 50 supplying ECs for being mounted on PCBs 16 of a first sort and the tables 44D–44F support the cartridges 50 supplying ECs for being mounted on PCBs 16 of a second sort different from the first sort of PCBs 16. First, there will be described the case where the tables 44A–44C of the right table group are used for supplying ECs. In this case, the tables 44D–44F of the left table group wait in the LW area where the tables 44D–44F are engaged with the engaging devices 330D–330F of the left table retracting device 304, respectively, and the shutter 460 provided between the LW area and the LHO area is closed, as shown in FIG. 23(A). Thus, the operator who is working in the LW area is prevented from contacting the tables 44A–44C which are supplying ECs or the cartridges 50 supported thereon. The tables 44A–44C are positioned in the LHO area and the CS area where the tables 44A–44C are engaged with the carriers 300A, 300B, 300C, respectively, and are not engaged with the engaging devices 330A–330C of the right table retracting device 302. The shutter 460 provided between the RW area and the RHO area is open.

When the EC supplying operation is carried out, each of the tables 44A–44C is moved within the CS area for supplying ECs, as shown in FIG. 23(B). When the table 44A is moved to the RHO area after completing the supplying of ECs, the table 44B is concurrently moved to the CS area for supplying ECs, and the table 44C is moved to the one-table portion of the CS area that is adjacent to the LHO area.

After all the tables 44A–44C have completed the supplying of ECs, the tables 44A–44C are moved back by the carriers 300A–300C to their original positions, so that they are ready for supply ECs to the next PCB of the same (i.e., first) sort. The engaging devices 330A–330C of the right table retracting device 302 remain in the RHO area and the two-table portion of the CS area that is adjacent to the RHO area, and wait for the supplying of ECs to each of a predetermined number of PCBs 16 of the first sort.

In the case where the tables 44D–44F of the left table group are used for supplying ECs to a PCB 16 of the second sort after the supplying of ECs to the predetermined number of PCBs 16 of the first sort, the tables 44A–44C are engaged with the engaging devices 330A–330C of the right table retracting device 302, respectively, and then are disengaged from the carriers 300A–300C, respectively. The tables 44A–44C are moved altogether by the right movable member 312 to the RW area, as shown in FIG. 23(C). After the shutter 460 between the LW area and the CM area is opened, the tables 44D–44F are moved altogether from the LW area to the CS area where the tables 44D–44F are engaged with the carriers 300A–300C, respectively, and are disengaged from the engaging devices 330D–330F, respectively, as shown in FIG. 23(D). Then, each of the tables 44D–44F is used for supplying ECs, in the order of description.

While the tables 44D–44F supplies the ECs, the shutter 460 between the RW area and the RHO area remains closed for preventing the operator who is working for replacing the cartridges 50, etc. with new ones in the RW area, from contacting the tables 44D–44F, etc.

In the second EC supplying mode, the tables 44D–44F of the left table group may be adapted to support the same sorts of cartridges 50 as those supported by the tables 44A–44C of the right table group, so that the two groups of tables supply ECs to the PCBs 16 of the same sort. This modified mode is advantageous in the case where there are a great number of PCBs 16 of a same sort on each of which ECs are mounted and accordingly the ECs supplied by just one group of tables are insufficient for all the PCBs 16. That is, that one group of tables are replaced with the other group of tables, for supplying ECs to the other PCBs 16. Thus, the supplying of ECs to the great number of PCBs 16 is not interrupted by replenishing of ECs to the tables, and is continuously performed. Therefore, the ECs are mounted on the PCBs 16 with high efficiency.

In the third EC supplying mode, the tables 44A–44C of the right group and the tables 44D–44F of the left group are alternately used for supplying ECs to a single PCB 16 or a predetermined numbers of PCBs 16 of a first sort, and a single PCB 16 or a predetermined numbers of PCBs 16 of a second sort, respectively. Therefore, in the third mode, ECs are supplied in the same manner as that employed in the second mode, except that the two shutters 460 remain opened. Since the two groups of tables are alternately used for supplying ECs, the operator should not work in the RW nor LW area, thereby not requiring the shutters 460 to be closed.

As is apparent from the foregoing description, the present EC supplying apparatus 10 can operate in the first EC supplying mode in which the tables 44 are moved in pairs for supplying ECs. Therefore, the table that has just completed the EC supplying can quickly be changed with the table that is next to supply ECs. In particular, when the two tables are changed with each other, the trailing table is moved in synchronism with the movement of the leading table. Thus, the two tables can be changed with each other in a short time, and the lowering of EC supplying efficiency can be prevented.

The table which will supply ECs subsequent to the two tables which are being moved in the CS area, is moved to the one-table portion of the CS area that is adjacent to the RHO or LHO area, and waits there. Therefore, the waiting table can quickly be moved to the position where the table can follow the new leading table as the trailing one of the above-indicated two tables.

Next, there will be described a second embodiment of the present invention by reference to FIGS. 24, 25, and 26. The second embodiment relates to an EC supplying apparatus employing different left and right table retracting devices (only the left device 510 is shown) in place of the left and right table retracting devices 304, 302 wherein the movable-member moving devices 384, 316 are driven by the servomotors 390, 322 for moving the movable members 382, 312, respectively. The table retracting device 510 employs, as a drive source, an air cylinder as one of fluid-pressure cylinders. The right table retracting device (not shown) has the same construction as that of the left device 510 which will be described below.

There is provided, in the LW (left waiting) area on a bed 512, a "rodless" cylinder 514 as a drive source such that the the cylinder 514 extends parallel to the X direction. The rodless cylinder 514 is an air-pressure cylinder which has no piston rod and has a movable part 516. The movable part 516 is formed as a part integral with a piston of the cylinder 514, and air-tightly projects outward through a housing of the cylinder 514. When the movable part 516 is moved, a movable body 518 fixed to the movable part 516 is moved in the X direction by being guided by guide rails (not shown).

The movable body 518 is elongate in the X direction and supports, on the upper surface thereof, a guide rail 520 which extends in the X direction. A movable member 522 is fit on the guide rail 520 via a pair of guide blocks 524, such that the movable member 522 is movable relative to the guide rail 520. The movable member 522 supports, on the upper surface thereof, a rotatable axis member 526 such that the axis member 526 is rotatable about an axis line parallel to the X direction. Three pairs of engaging projections 528 are fixed to the axis member 526 such that the three pairs of projections 528 are distant from one another at a regular interval longer than the length of the tables 530D–530F (i.e., dimension thereof in the X direction), like the engaging devices 330D–330F of the left table retracting device 304 employed in the first embodiment.

Figure 24:
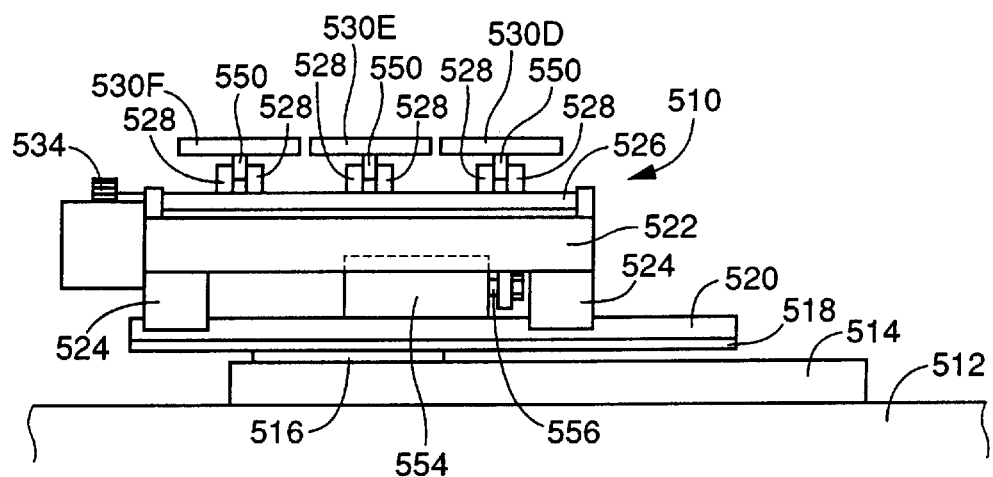
FIG. 24 is an elevation view of a left table retracting device of an EC supplying apparatus as a second embodiment of the present invention.
Figure 25:
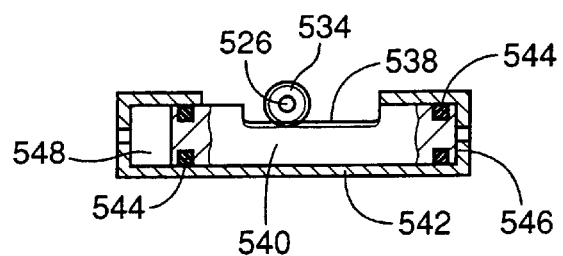
FIG. 25 is a partly cut away, elevation view of an engaging-member drive device which drives an engaging member of an engaging device as an element of the left table retracting device of FIG. 24.

A pinion 534 is fixed to one of opposite ends of the axis member 526 and, as shown in FIG. 25, is meshed with a rack 538. The rack 538 is provided as a part integral with a piston 540. The piston 540 is air-tightly fit in a housing 542 via O-shaped rings 544 such that the piston 540 is movable in the housing 542. Two air chambers 546, 548 which are provided on both sides of the piston 540, respectively, are selectively communicated with an air source (not shown) and the atmosphere, respectively, or vice versa, so that the piston 540 is moved in the housing 542. Thus, the rack 538 is moved and the pinion 534 is rotated. The rotation of the pinion 534 results in rotating the axis member 526 between its engageable position in which the three pairs of engaging projections 528 sandwich, in the X direction, corresponding engaging projections 550 of the tables 530D–530F, respectively, as shown in FIG. 24, and a non-engageable position in which the engaging projections 528 are not engageable with the engaging projections 550. Thus, the three engaging devices 530D–530F employ the three pairs of engaging projections 528 as three pairs of engaging members, respectively, and employ a common engaging-member drive device which is provided by the axis member 526, the rack 538, the piston 540, and the pinion 534.

The movable member 522 is engaged with a piston rod 556 of an air cylinder 554 as a drive source which is mounted on the movable body 518. The piston rod 556 can be extended or retracted by increments which are equal to the regular intervals at which the three pairs of engaging projections 528 are provided, and accordingly the movable member 522 can be moved forward or backward relative to the movable body 518 by the same increments. The movable member 522 is moved directly by the air cylinder 554, and is moved indirectly with the movable body 518 being moved by the rodless cylinder 514. Thus, the movable body 518, the air cylinder 554, the rodless cylinder 514, etc. cooperate with one another to provide a movable-member moving device.

Figure 26:
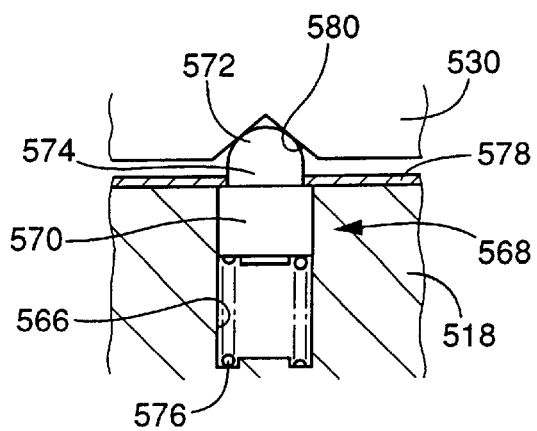
FIG. 26 is a view of a table positioning device which is retracted by the left table retracting device of FIG. 24.

As shown in FIG. 26, the movable body 518 has three fitting holes 566 each of which has a bottom and opens in the upper surface of the body 518. The three holes 566 are formed at the same intervals as those at which the three pairs of engaging projections 528 are provided. A stepped positioning pin 568 is slideably fit in each of the three holes 566. The stepped pin 568 includes a large-diameter portion 570 and a small-diameter portion 574 which has a diameter smaller than that of the large-diameter portion 570 and includes a hemispherical engaging portion 572. The large-diameter portion 570 of each positioning pin 568 is fit in the corresponding fitting hole 566, and is biased upward by an elastic member in the form of a compression coil spring 576 as a biasing member that is provided between the portion 570 and the bottom of the hole 566. Thus, the large-diameter portion 570 is engaged with a cover member 578, so that the pin 568 is prevented from coming off the hole 566. The cover member 578 has three through-holes each of which permits the small-diameter portion 574 of a corresponding one of the three pins 568 to extend therethrough. Each of the three positioning pins 568 can fit in a notch 580 formed in a corresponding one of the three tables 530D–530F, thereby positioning the one table. Thus, the positioning pins 568, the notches 580, the compression coil springs 576, etc. cooperate with one another to provide three positioning devices for positioning the three tables 530D–530F, respectively.

For example, when the present EC supplying apparatus is operated in the previously-described first EC supplying mode, first, the three tables (not shown) of the right table group are moved one by one by carriers (not shown) for supplying ECs, while the three tables 530D–530F wait in the LW area where the three engaging projections 550 are engaged with the three pairs of engaging projections 528, respectively, and the three notches 580 are engaged with the three positioning pins 568, respectively.

When the right-hand end table of the three tables of the right table group has finished its EC supplying, the right-hand end table 530D of the left table group is moved from the LW area to the LHO area, together with the other two tables 530E, 530F. This is effected by moving the movable member 522 rightward by operating the air cylinder 554. When the movable member 522 is moved in this way, the three positioning pins 568 are retracted into the holes 566 because of the inclination of inner surfaces of the notches 580. Thus, the tables 530D–530F are permitted to move rightward.

After the table 530D is thus moved and subsequently engaged with the corresponding carrier (not shown), the axis member 526 is rotated so that the three pairs of engaging projections 528 are disengaged from the three engaging projection 550. Thus, the table 530D is permitted to move with the corresponding carrier. In this state, the tables 530E, 530F are held in position relative to the movable body 518 because the respective notches 580 thereof are engaged with the positioning pins 568 which had been engaged with the respective notches 580 of the tables 530D, 530E. Thus, the tables 530E, 530F are prevented from moving out of position, even if the pairs of engaging projections 528 are disengaged from the engaging projections 550.

Subsequently, the movable member 522 is returned leftward by the air cylinder 554. Since the pairs of engaging projections 528 are not engaged with the engaging projections 550 of the tables 530E, 530F, the tables 530E, 530F are not moved with the movable member 522. After this return, the axis member 526 is rotated back so that the two pairs of engaging projections 528 which had been engaged with the respective projections 550 of the tables 530D, 530E are engaged with the respective projections 550 of the tables 530E, 530F. Thus, when the table 530D is moved to the LHO area, the tables 530E, 530F are moved toward the CM area by the distance equal to the length of one table 530 in the X direction. When the movable member 522 is moved rightward next, the table 530E is moved to the LHO area.

After all the tables 530D–530F are engaged with the three carriers, respectively, and are disengaged from the three pairs of engaging projections 528, the movable body 518 is moved rightward by the rodless cylinder 514 so that the three pairs of projections 528 are moved to the LHO area and the two-table portion of the CS area that is adjacent to the LHO area and wait for the completion of the EC supplying operation. In this state, the piston rod 556 of the air cylinder 554 is held in its retracted position, the movable member 522 is held in its left-hand end position relative to the movable body 518, and the pairs of projections 528 are held in their non-engageable positions. The three tables 530D–530F which have finished their EC supplying are moved by the corresponding carriers to respective positions where the tables 530D–530F are engageable with the three pairs of projections 528. The respective projections 550 of the tables 530D–530F are engaged with the three pairs of projections 528 by rotating the axis member 526. Subsequently, the tables 530D–530F are disengaged from the carriers, and the movable body 518 is moved to the LW area. Thus, the three tables 530D–530F are simultaneously moved to the LW area.

When the present EC supplying apparatus is operated in the second or third EC supplying mode, the movable body 518 is moved by the rodless cylinder 514 so that the three tables 530D–530F are simultaneously moved to the LHO are and the two-table portion of the CS area that is adjacent to the LHO area where the tables 530D–530F are disengaged from the pairs of projections 528 and are engaged with the carriers. After the EC supplying operation ends, the three tables 530D–530F are simultaneously engaged with the movable member 522, disengaged from the carriers, and moved to the LW area with the movable body 518 being moved by the air cylinder 514.

In the second embodiment shown in FIGS. 24 to 26, in the case where the EC supplying apparatus is operated in the first EC supplying mode only, the left (or right) table retracting device 510 may be provided by the movable member 522 which is provided with three engaging devices like the devices 330D–330F and which is reciprocated by the air cylinder 554. In this modified case, the tables 530D–530F are moved one by one to the LHO area for supplying ECs, in the same manner as that employed in the original, non-modified second embodiment. However, after the tables 530D–530F have finished their EC supplying, the tables 530D–530F are returned one by one to the LW area by the reciprocal movements of the movable member 522. In this case, the positioning pins 568 are provided on the bed 512, so that the tables 530D–530F can be held in position relative to the bed 512.

The second embodiment may be modified in such a manner only that the positioning pins 568 are provided on the bed 512 in place of on the movable body 518, so that the tables 530D–530F can be held in position relative to the bed 512.

While the present invention has been described in its preferred embodiments, the invention may otherwise be embodied.

For example, although in each of the illustrated embodiments the tables are moved in pairs within the CS area such that the trailing table follows the leading table almost during the EC supplying of the leading table, it is possible that the trailing table be moved to the CS area just before the end of the EC supplying of the leading table so as to follow the leading table. The timing of the end of EC supplying of the leading table can be known from, e.g., the EC mounting control program pre-stored in the ROM 474 of the control device 470. The CPU 472 of the control device 470 produces a table moving command to move a table which is next to supply ECs, to the position where the table starts to follow a table which is currently supplying ECs. Thus, the control device 470 functions as a means for commanding a second table to start following a first table at the end of EC supplying of the first table.

In addition, although in each of the illustrated embodiments each of the tables is moved, as a general rule, in only one direction for supplying ECs, it is possible that each table be moved in opposite directions for supplying ECs. In this case, the number of the table or tables which is or are moved for supplying ECs within the CS area may be one or two. In the case where two tables are simultaneously moved, those two tables must be moved in synchronism with each other throughout the EC supplying of the leading table.

In each of the illustrated embodiments, in the case where the six tables 44A–44F are used as a single group for supplying ECs, a third table which waits in the LW area while two tables are moved for supplying ECs in the CS area is moved to the one-table portion of the CS area that is adjacent to the LHO area so as to wait there, when the EC supplying of the trailing table has progressed to such an extent that even if the trailing table is moved back over some distance, the trailing table cannot collide with the third table that might be positioned in the one-table portion of the CS area. However, in the case where the maximum distance over which the trailing table can be moved back for supplying an EC is short and the leading table is moved to the RHO area (i.e., becomes unable to be moved back for supplying an EC) shortly after the trailing table starts supplying ECs, it is possible that the third table be moved to the CS area to follow the trailing table which is now supplying ECs, just after, or simultaneously with, the retraction of the leading table to the RHO area. In the last case, the third table does not wait in the one-table portion of the CS are that is adjacent to the LHO area.

Each of the illustrated embodiments may be adapted such that in normal cases the tables are moved one by one for supplying ECs and, in special cases only, the tables are moved in pairs. In those modified embodiments, each pair of tables may be moved in synchronism with each other or otherwise the trailing table may be moved at an acceleration or deceleration value smaller than that of the leading table.

While in each of the illustrated embodiments each abnormal-table-proximity sensor 484 is provided by a photoelectric switch of a transmission type, the sensor 484 may be provided by a photoelectric switch of a reflection type, or a limit switch, a proximity switch, or the like.

Although in each of the illustrated embodiments all the tables which are moving are stopped when an abnormal table proximity is detected, it is possible to stop only the tables which are in abnormal proximity to each other.

Although in each of the illustrated embodiments the abnormal movements of the carriers are identified based on the amounts of the carrier servomotors 412 detected by the encoders 418, it is possible to employ exclusive detectors for detecting the abnormalities of the carriers. For example, the carriers may be provided with respective detectable things, and the bed is provided with detectors for detecting the detectable things of the carriers, respectively.

In the first embodiment, the respective movable members 382, 312 of the left and right table retracting tables 304, 302 are moved by the servomotors 390, 322 as the drive sources, and are stopped at any desired positions based on the respective outputs of the encoders 394, 324. However, the servomotors 390, 322 may be replaced by common electric motors other than servomotors, and detectors may be provided at the positions where the movable members 382, 312 are stopped, for detecting respective detectable things provided on the movable members 382, 312.

While in each of the illustrated embodiments the respective rotations of the carrier servomotors 412 are transmitted to the feeding screws 400 via the timing belts 416 and the timing pulleys 414, those rotations may be transmitted to the screws 400 via different transmitting devices, e.g., devices each of which is provided by a chain, a sprocket, etc.

In the second embodiment shown in FIGS. 24 to 26, the movable body 518 may be moved by a fluid-pressure cylinder different from the rodless cylinder 514, such as an air cylinder having a piston rod. In addition, the movable member 522 may be moved by a rodless cylinder.

In each of the illustrated embodiments, the left or right table retracting device may be modified to include only a single engaging device for the tables of the left or right table group, respectively. In this case, it is required that the single engaging device be able to move in at least the LW or RW area and the LHO or RHO area so as to carry each of a plurality of tables between the LW or RW area and the LHO or RHO area. In addition, it is preferred that a plurality of positioning devices be provided in the LW or RW area for positioning the tables relative to the bed.

In the case where the respective movable members of the left and right table retracting devices are moved within respective ranges which do not overlap each other, it is possible to employ a single movable-member guide which extends over the LW and RW areas and the CM area. In this case, the left half portion of the single guide provides a movable-member guide for the LW area and the left half portion of the CM area, and the right half portion of the single guide provides a movable-member guide for the RW area and the right half portion of the CM area.

The principle of the present invention is applicable to an EC supplying apparatus for supplying ECs to an EC mounting apparatus which includes a component holding head such as a component sucking head and a moving device for moving the holding head in one direction or two orthogonal directions in a horizontal direction so that an EC held by the holding head is mounted on an object such as a PCB. In addition, the present invention is applicable to an EC supplying apparatus for supplying ECs to an EC conveying apparatus which conveys ECs, in place of an EC mounting apparatus which mounts ECs.

The present invention may be embodied by changing one or more elements of each one of the illustrated embodiments with one or more elements of another or other embodiments.

It is to be understood that the present invention may be embodied with other changes, improvements, and modifications that may occur to those skilled in the art without departing from the spirit and scope of the invention.

What is claimed is:

1. An electronic-component supplying apparatus, comprising:

a bed including at least one linear table guide;

at least four tables each of which is supported by said table guide such that said each table is movable relative to the bed, said each table supporting a plurality of electronic-component supplying cartridges such that respective component-supply portions of said cartridges are arranged along a straight line parallel to said table guide, said at least four tables including at least one table belonging to a first table group, and at least one table belonging to a second table group;

at least three carriers each one of which is movable, independent of the other carriers, through a corresponding one of at least three routes which is associated with said each one carrier exclusively, said each one carrier being stoppable at any position on said corresponding one route, said at least three routes extending parallel to one another and said table guide, within a carrier-movement area on said bed which is an intermediate area on said bed in a direction parallel to the table guide;

at least three carrier moving devices which are connected to said at least three carriers, respectively, and which move said at least three carriers through said at least three routes, respectively;

a plurality of carrier-related engaging devices and a plurality of engageable portions each of which is disengageably engageable with at least one corresponding engaging device of said engaging devices, one of (a) each of said at least four tables and (b) each of said at least three carriers supporting a corresponding one of said engaging devices, the other of (a) said each of said at least four tables and (b) said each of said at least three carriers including a corresponding one of said plurality of engageable portions;

a first table retracting device which retracts said at least one table of said first table group, to a first waiting area on said bed which is one of two side areas on both sides of said intermediate area on said bed in said direction parallel to said table guide;

a second table retracting device which retracts said at least one table of said second table group, to a second waiting area on said bed which is the other side area on said bed; and a control device which is connected to said at least three carrier moving devices, said engaging devices and said first and second table retracting devices and which controls said at least three carrier moving devices, said engaging devices and said first and second table retracting devices, such that a first carrier of said at least three carriers is disengageably engaged with a first table of said at least four tables and iteratively moves and stops the first table, in a first direction parallel to said table guide, for supplying electronic components, and such that a second carrier of said at least three carriers is disengageably engaged with a second table of said at least four tables and moves the second table that is not supplying the electronic components, to follow, in the first direction, the first table that is being moved and stopped for supplying the electronic components, at an acceleration whose absolute value is smaller than that of an acceleration of the first table and at a deceleration whose absolute value is smaller than that of a deceleration of the first table, wherein said at least four tables include at least two tables belonging to said first table group, and at least two tables belonging to said second table group, and said first table retracting device comprises;

a first movable member which is movable in said direction parallel to said table guide;

at least one first-movable-member-related engaging device and a plurality of first engageable portions each of which is disengageably engageable with said at least one first-movable-member-related engaging device, one of (a) said first movable member and (b) said at least two tables of said first table group supporting said at least one first-movable-member-related engaging device, the other of (a) said first movable member and (b) said at least two tables of said first table group including said plurality of first engageable portions; and a first moving device which is connected to said first movable member and which moves said first movable member within a first composite area provided by said carrier-movement area and said first waiting area, and wherein said second table retracting device comprises:

a second movable member which is movable in said direction parallel to said table guide;

at least one second-movable-member-related engaging device and a plurality of second engageable portions each of which is disengageably engageable with said at least one second-movable-member-related-engaging device, one of (a) said second movable member and (b) said at least two tables of said second table group supporting said at least one second-movable-member-related engaging device, the other of (a) said second movable member and (b) said at least two tables of said second table group, including said plurality of second engageable portions; and a second moving device which is connected to said second movable member and moves said second movable member within a second composite area provided by said carrier-movement area and said second waiting area and wherein said first table retracting device further comprises a first guide which guides said first movable member and is associated therewith exclusively, and said second table retracting device further comprises a second guide which guides said second movable member and is associated therewith exclusively, and said first guide extends over said first waiting area and at least a portion of said carrier-movement area, and said second guide extends over said second waiting area and at least a portion of said carrier-movement area.

2. An apparatus according to claim 1, wherein said at least three carrier moving devices comprise:

a same number of feeding screws as a number of said at least three carriers, said feeding screws being provided on said bed such that the feeding screws extend parallel to one another and said table guide;

a plurality of nuts each of which is fixed to a corresponding one of said carriers and is threadedly engaged with a corresponding one of said feeding screws; and a plurality of drive devices each of which rotates a corresponding one of said feeding screws which is associated with said each drive device exclusively.

3. An electronic-component supplying apparatus, comprising:

a bed including at least one linear table guide;

at least four tables each of which is supported by said table guide such that said each table is movable relative to the bed, said each table supporting a plurality of electronic-component supplying cartridges such that respective component-supply portions of said cartridges are arranged along a straight line parallel to said table guide, said at least four tables including at least one table belonging to a first table group, and at least one table belonging to a second table group;

at least three carriers each one of which is movable, independent of the other carriers, through a corresponding one of at least three routes which is associated with said each one carrier exclusively, said each one carrier being stoppable at any position on said corresponding one route, said at least three routes extending parallel to one another and said table guide, within a carrier-movement area on said bed which is an intermediate area on said bed in a direction parallel to the table guide;

at least three carrier moving devices which are connected to said at least three carriers, respectively, and which move said at least three carriers through said at least three routes, respectively;

a plurality of carrier-related engaging devices and a plurality of engageable portions each of which is disengageably engageable with at least one corresponding engaging device of said engaging devices, one of (a) each of said at least four tables and (b) each of said at least three carriers supporting a corresponding one of said engaging devices, the other of (a) said each of said at least four tables and (b) said each of said at least three carriers including a corresponding one of said plurality of engageable portions;

a first table retracting device which retracts said at least one table of said first table group, to a first waiting area on said bed which is one of two side areas on both sides of said intermediate area on said bed in said direction parallel to said table guide;

a second table retracting device which retracts said at least one table of said second table group, to a second waiting area on said bed which is the other side area on said bed; and a control device which is connected to said at least three carrier moving devices, said engaging devices and said first and second table retracting devices and which controls said at least three carrier moving devices, said engaging devices and said first and second table retracting devices, such that a first carrier of said at least three carriers is disengageably engaged with a first table of said at least four tables and iteratively moves and stops the first table, in a first direction parallel to said table guide, for supplying electronic components, and such that a second carrier of said at least three carriers is disengageably engaged with a second table of said at least four tables and moves the second table that is not supplying the electronic components, to follow, in the first direction, the first table that is being moved and stopped for supplying the electronic components, at an acceleration whose absolute value is smaller than that of an acceleration of the first table and at a deceleration whose absolute value is smaller than that of a deceleration of the first table, wherein said at least four tables include at least two tables belonging to said first table group, and at least two tables belonging to said second table group, and said first table retracting device comprises;

a first movable member which is movable in said direction parallel to said table guide;

at least one first-movable-member-related engaging device and a plurality of first engageable portions each of which is disengageably engageable with said at least one first-movable-member-related engaging device, one of (a) said first movable member and (b) said at least two tables of said first table group supporting said at least one first-movable-member-related engaging device, the other of (a) said first movable member and (b) said at least two tables of said first table group including said plurality of first engageable portions; and a first moving device which is connected to said first movable member and which moves said first movable member within a first composite area provided by said carrier-movement area and said first waiting area, and wherein said second table retracting device comprises:

a second movable member which is movable in said direction parallel to said table guide;

at least one second-movable-member-related engaging device and a plurality of second engageable portions each of which is disengageably engageable with said at least one second-movable-member-related-engaging device, one of (a) said second movable member and (b) said at least two tables of said second table group supporting said at least one second-movable-member-related engaging device, the other of (a) said second movable member and (b) said at least two tables of said second table group including said plurality of second engageable portions; and a second moving device which is connected to said second movable member and moves said second movable member within a second composite area provided by said carrier-movement area and said second waiting area and wherein said first moving device comprises:

a plurality of first rotatable members which are provided at opposite ends of said first composite area and each of which is rotatable about an axis line extending in a direction perpendicular to said table guide;

at least one first wound-on member which is wound on said first rotatable members so as to connect the first rotatable members and extend parallel to said table guide; and a first drive device which rotates at least one of said first rotatable members, said first movable member being connected to a portion of said first wound-on member, and wherein said second moving device comprises:

a plurality of second rotatable members which are provided at opposite ends of said second composite area and each of which is rotatable about an axis line extending in a direction perpendicular to said table guide;

a second wound-on member which is wound on said second rotatable members so as to connect the second rotatable members and extend parallel to said table guide; and a second drive device which rotates one of said second rotatable members, said second movable member being connected to a portion of said second wound-on member.

4. An apparatus according to claim 1, further comprising a component-supply control device which controls said carriers, said carrier-related engaging devices, and said first and second table retracting devices in a single-group mode in which said at least one table of one of said first and second groups iteratively carries out a first sequence of movements for supplying electronic components while said at least one table of the other group is not moved, and a two-group mode in which said tables of both of said first and second groups iteratively carry out a second sequence of movements for supplying electronic components.

5. An apparatus according to claim 1, wherein said at least one table guide commonly supports every one of said at least four tables.

6. An apparatus according to claim 1, further comprising at least three carrier guides each of which guides a corresponding one of said at least three carriers and is associated with said corresponding one carrier exclusively.

7. An apparatus according to claim 1, wherein said carrier-related engaging devices are provided on said carriers, respectively, and each of said carrier-related engaging devices is engageable with the engageable portion of at least one corresponding table of said tables.

8. An apparatus according to claim 1, wherein said first table group includes a same number of tables as a number of the tables of said second table group, and wherein each of said first and second table retracting devices retracts the tables of a corresponding one of the first and second table groups, to a corresponding one of the first and second waiting areas.

9. An apparatus according to claim 1, wherein said first guide extends over said first waiting area and an entirety of said carrier-movement area, and said second guide extends over said second waiting area and an entirety of said carrier-movement area.

10. An apparatus according to claim 1, wherein the control device controls, when the first carrier carrying the first table is moved in a second direction opposite to the first direction, the second carrier carrying the second table to move in the second direction at an acceleration equal to an acceleration of the first carrier and at a deceleration equal to a deceleration of the first carrier.

11. An electronic-component supplying apparatus, comprising:

a bed including at least one linear table guide;

at least four tables each of which is supported by said table guide such that said each table is movable relative to the bed, said each table supporting a plurality of electronic-component supplying cartridges such that respective component-supply portions of said cartridges are arranged along a straight line parallel to said table guide, said at least four tables including at least one table belonging to a first table group, and at least one table belonging to a second table group;

at least three carriers each one of which is movable, independent of the other carriers, through a corresponding one of at least three routes which is associated with said each one carrier exclusively, said each one carrier being stoppable at any position on said corresponding one route, said at least three routes extending parallel to one another and said table guide, within a carrier-movement area on said bed which is an intermediate area on said bed in a direction parallel to the table guide;

at least three carrier moving devices which are connected to said at least three carriers, respectively, and which move said at least three carriers through said at least three routes, respectively;

a plurality of carrier-related engaging devices and a plurality of engageable portions each of which is disengageably engageable with at least one corresponding engaging device of said engaging devices, one of (a) each of said at least four tables and (b) each of said at least three carriers supporting a corresponding one of said engaging devices, the other of (a) said each of said at least four tables and (b) said each of said at least three carriers including a corresponding one of said plurality of engageable portions;

a first table retracting device which retracts said at least one table of said first table group, to a first waiting area on said bed which is one of two side areas on both sides of said intermediate area on said bed in said direction parallel to said table guide;

a second table retracting device which retracts said at least one table of said second table group, to a second waiting area on said bed which is the other side area on said bed; and a control device which is connected to said at least three carrier moving devices, said engaging devices and said first and second table retracting devices and which controls said at least three carrier moving devices, said engaging devices and said first and second table retracting devices, such that a first carrier of said at least three carriers which is disengageably engaged with a first table of said at least four tables iteratively moves and stops the first table, in a first direction parallel to said table guide, for supplying electronic components, such that a second carrier of said at least three carriers which is disengageably engaged with a second table of said at least four tables moves the second table that is not supplying the electronic components, to follow, in the first direction, the first table that is being moved and stopped for supplying the electronic components, and such that a third carrier of said at least three carriers which is disengageably engaged with a third table of said at least four tables which is located, in the first direction, on a downstream side of the first table that is supplying the electronic components, allows the third table to be received by one of the first and second table retracting devices which corresponds to one of the first and second table groups to which the third table belongs, wherein said at least four tables include at least two tables belonging to said first table group, and at least two tables belonging to said second table group, and said first table retracting device comprises;

a first movable member which is movable in said direction parallel to said table guide;

at least one first-movable-member-related engaging device and a plurality of first engageable portions each of which is disengageably engageable with said at least one first-movable-member-related engaging device, one of (a) said first movable member and (b) said at least two tables of said first table group supporting said at least one first-movable-member-related engaging device, the other of (a) said first movable member and (b) said at least two tables of said first table group including said plurality of first engageable portions; and a first moving device which is connected to said first movable member and which moves said first movable member within a first composite area provided by said carrier-movement area and said first waiting area, and wherein said second table retracting device comprises:

a second movable member which is movable in said direction parallel to said table guide;

at least one second-movable-member-related engaging device and a plurality of second engageable portions each of which is disengageably engageable with said at least one second-movable-member-related-engaging device, one of (a) said second movable member and (b)

said at least two tables of said second table group supporting said at least one second-movable-member-related engaging device, the other of (a) said second movable member and (b) said at least two tables of said second table group including said plurality of second engageable portions; and a second moving device which is connected to said second movable member and moves said second movable member within a second composite area provided by said carrier-movement area and said second waiting area and wherein said first table retracting device further comprises a first guide which guides said first movable member and is associated therewith exclusively, and said second table retracting device further comprises a second guide which guides said second movable member and is associated therewith exclusively, and said first guide extends over said first waiting area and at least a portion of said carrier-movement area, and said second guide extends over said second waiting area and at least a portion of said carrier-movement area.

12. An electronic-component supplying apparatus comprising:

a bed including at least one linear table guide;

at least four tables each of which is supported by said table guide such that said each table is movable relative to the bed, said each table supporting a plurality of electronic-component supplying cartridges such that respective component-supply portions of said cartridges are arranged along a straight line parallel to said table guide, said at least four tables including at least one table belonging to a first table group, and at least one table belonging to a second table group;

at least three carriers each one of which is movable, independent of the other carriers, through a corresponding one of at least three routes which is associated with said each one carrier exclusively, said each one carrier being stoppable at any position on said corresponding one route, said at least three routes extending parallel to one another and said table guide, within a carrier-movement area on said bed which is an intermediate area on said bed in a direction parallel to the table guide;

at least three carrier moving devices which are connected to said at least three carriers, respectively, and which move said at least three carriers through said at least three routes respectively;

a plurality of carrier-related engaging devices and a plurality of engageable portions each of which is disengageably engageable with at least one corresponding engaging device of said engaging devices, one of (a) each of said at least four tables and (b) each of said at least three carriers supporting a corresponding one of said engaging devices, the other of (a) said each of said at least four tables and (b) said each of said at least three carriers including a corresponding one of said plurality of engageable portions;

a first table retracting device which retracts said at least one table of said first table group, to a first waiting area on said bed which is one of two side areas on both sides of said intermediate area on said bed in said direction parallel to said table guide;

a second table retracting device which retracts said at least one table of said second table group, to a second waiting area on said bed which is the other side area on said bed; and a control device which is connected to said at least three carrier moving devices, said engaging devices and said first and second table retracting devices and which controls said at least three carrier moving devices, said engaging devices and said first and second table retracting devices, such that a first carrier of said at least three carriers which is disengageably engaged with a first table of said at least four tables iteratively moves and stops the first table, in a first direction parallel to said table guide, for supplying electronic components, such that a second carrier of said at least three carriers which is disengageably engaged with a second table of said at least four tables moves the second table to follow, in the first direction, the first table that is supplying the electronic components, and such that a third carrier of said at least three carriers which is disengageably engaged with a third table of said at least four tables which is located, in the first direction, on a downstream side of the first table that is supplying the electronic components, allows the third table to be received by one of the first and second table retracting devices which corresponds to one of the first and second table groups to which the third table belongs, wherein the control device controls said at least three carrier moving devices, said engaging devices and said first and second table retracting devices, such that after the third table is received by said one table retracting device, the third carrier is disengaged from the third table and is moved, in a second direction opposite to the first direction, to a first position, within the carrier-movement area, where the third carrier is disengageably engaged with a fourth table of said at least four tables which is located on an upstream side of the second table in the first direction.

13. An apparatus according to claim 12, wherein the control device controls said at least three carrier moving devices such that after the second table starts supplying electronic components, the third carrier moves, in the first direction, the fourth table from the first position to a second position nearer to a component-supply position, within the carrier-movement area, where each of the electronic-component supplying cartridges on the second table supplies at least one electronic component from the component supply portion thereof.

14. An apparatus according to claim 13, wherein the control device controls said at least three carrier moving devices such that when the first carrier carrying the first table is moved in the second direction after the second table starts supplying the electronic components, the third carrier carrying the fourth table is moved in the second direction from the second position to the first position.

15. An electronic-component supplying apparatus, comprising:

a bed including at least one linear table guide;

at least four tables each of which is supported by said table guide such that said each table is movable relative to the bed, said each table supporting a plurality of electronic-component supplying cartridges such that respective component-supply portions of said cartridges are arranged along a straight line parallel to said table guide, said at least four tables including at least one table belonging to a first table group, and at least one table belonging to a second table group;

at least three carriers each one of which is movable, independent of the other carriers, through a corresponding one of at least three routes which is associated with said each one carrier exclusively, said each one carrier being stoppable at any position on said corresponding one route, said at least three routes extending parallel to one another and said table guide, within a carrier-movement area on said bed which is an intermediate area on said bed in a direction parallel to the table guide;

at least three carrier moving devices which are connected to said at least three carriers, respectively, and which move said at least three carriers through said at least three routes, respectively;

a plurality of carrier-related engaging devices and a plurality of engageable portions each of which is disengageably engageable with at least one corresponding engaging device of said engaging devices, one of (a) each of said at least four tables and (b) each of said at least three carriers supporting a corresponding one of said engaging devices, the other of (a) said each of said at least four tables and (b) said each of said at least three carriers including a corresponding one of said plurality of engageable portions;

a first table retracting device which retracts said at least one table of said first table group, to a first waiting area on said bed which is one of two side areas on both sides of said intermediate area on said bed in said direction parallel to said table guide;

a second table retracting device which retracts said at least one table of said second table group, to a second waiting area on said bed which is the other side area on said bed; and a control device which is connected to said at least three carrier moving devices, said engaging devices and said first and second table retracting devices and which controls said at least three carrier moving devices, said engaging devices and said first and second table retracting devices, such that a first carrier of said at least three carriers which is disengageably engaged with a first table of said at least four tables iteratively moves and stops the first table, in a first direction parallel to said table guide, for supplying electronic components, such that a second carrier of said at least three carriers which is disengageably engaged with a second table of said at least four tables moves the second table that is not supplying the electronic components, to follow, in the first direction, the first table that is being moved and stopped for supplying the electronic components, and such that a third carrier of said at least three carriers which is disengageably engaged with a third table of said at least four tables which is located, in the first direction, on a downstream side of the first table that is supplying the electronic components, allows the third table to be received by one of the first and second table retracting devices which corresponds to one of the first and second table groups to which the third table belongs, wherein said at least four tables include at least two tables belonging to said first table group, and at least two tables belonging to said second table group, and said first table retracting device comprises;

a first movable member which is movable in said direction parallel to said table guide;

at least one first-movable-member-related engaging device and a plurality of first engageable portions each of which is disengageably engageable with said at least one first-movable-member-related engaging device, one of (a) said first movable member and (b) said at least two tables of said first table group supporting said at least one first-movable-member-related engaging device, the other of (a) said first movable member and (b) said at least two tables of said first table group including said plurality of first engageable portions; and a first moving device which is connected to said first movable member and which moves said first movable member within a first composite area provided by said carrier-movement area and said first waiting area, and wherein said second table retracting device comprises:

a second movable member which is movable in said direction parallel to said table guide;

at least one second-movable-member-related engaging device and a plurality of second engageable portions each of which is disengageably engageable with said at least one second-movable-member-related-engaging device, one of (a) said second movable member and (b) said at least two tables of said second table group supporting said at least one second-movable-member-related engaging device, the other of (a) said second movable member and (b) said at least two tables of said second table group including said plurality of second engageable portions; and a second moving device which is connected to said second movable member and moves said second movable member within a second composite area provided by said carrier-movement area and said second waiting area and wherein said first moving device comprises:

a plurality of first rotatable members which are provided at opposite ends of said first composite area and each of which is rotatable about an axis line extending in a direction perpendicular to said table guide;

at least one first wound-on member which is wound on said first rotatable members so as to connect the first rotatable members and extend parallel to said table guide; and a first drive device which rotates at least one of said first rotatable members, said first movable member being connected to a portion of said first wound-on member, and wherein said second moving device comprises:

a plurality of second rotatable members which are provided at opposite ends of said second composite area and each of which is rotatable about an axis line extending in a direction perpendicular to said table guide;

a second wound-on member which is wound on said second rotatable members so as to connect the second rotatable members and extend parallel to said table guide; and a second drive device which rotates one of said second rotatable members, said second movable member being connected to a portion of said second wound-on member.

* * * * *